(12) United States Patent
Jang et al.

(10) Patent No.: US 12,336,179 B2
(45) Date of Patent: Jun. 17, 2025

(54) SEMICONDUCTOR DEVICE AND MANUFACTURING METHOD OF THE SEMICONDUCTOR DEVICE

(71) Applicant: SK hynix Inc., Icheon-si (KR)

(72) Inventors: Young Geun Jang, Hwaseong-si (KR); Wan Sup Shin, Seongnam-si (KR); Ki Hong Lee, Suwon-si (KR); Jae Jung Lee, Seoul (KR)

(73) Assignee: SK hynix Inc., Icheon-si (KR)

( * ) Notice: Subject to any disclaimer, the term of this patent is extended or adjusted under 35 U.S.C. 154(b) by 79 days.

(21) Appl. No.: 18/076,151

(22) Filed: Dec. 6, 2022

(65) Prior Publication Data

US 2023/0107126 A1  Apr. 6, 2023

Related U.S. Application Data

(63) Continuation of application No. 17/549,456, filed on Dec. 13, 2021, now Pat. No. 11,925,021, which is a
(Continued)

(30) Foreign Application Priority Data

Oct. 2, 2018  (KR) ........................ 10-2018-0117861

(51) Int. Cl.
| | | |
|---|---|---|
| *H10B 43/27* | (2023.01) | |
| *H01L 21/311* | (2006.01) | |
| *H01L 21/768* | (2006.01) | |
| *H01L 23/522* | (2006.01) | |
| *H10B 43/10* | (2023.01) | |

(Continued)

(52) U.S. Cl.
CPC ........ *H10B 43/27* (2023.02); *H01L 21/31144* (2013.01); *H01L 21/76897* (2013.01); *H01L 23/5226* (2013.01); *H10B 43/10* (2023.02); *H10B 43/40* (2023.02); *H10D 30/694* (2025.01); *H10D 64/037* (2025.01)

(58) Field of Classification Search
CPC .... H10B 43/27; H01L 23/5226; H01L 21/768
See application file for complete search history.

(56) References Cited

U.S. PATENT DOCUMENTS

| | | |
|---|---|---|
| 9,245,962 B1 | 1/2016 | Yang et al. |
| 9,379,133 B1 | 6/2016 | Jung |

(Continued)

FOREIGN PATENT DOCUMENTS

| | | |
|---|---|---|
| CN | 108063142 A | 5/2018 |
| CN | 111106126 A | 5/2020 |

(Continued)

*Primary Examiner* — Shih Tsun A Chou
(74) *Attorney, Agent, or Firm* — WILLIAM PARK & ASSOCIATES LTD.

(57) ABSTRACT

A semiconductor device, and method of manufacturing a semiconductor device, includes second conductive patterns separated from each other above a first stack structure which is penetrated by first channel structures and enclosing second channel structures coupled to the first channel structures, respectively. Each of the second conductive patterns includes electrode portions stacked in a first direction and at least one connecting portion extending in the first direction to be coupled to the electrode portions.

19 Claims, 31 Drawing Sheets

Related U.S. Application Data continuation of application No. 16/387,218, filed on Apr. 17, 2019, now Pat. No. 11,233,063.

(51) Int. Cl.
*H10B 43/40* (2023.01)
*H10D 30/69* (2025.01)
*H10D 64/01* (2025.01)

(56) References Cited

U.S. PATENT DOCUMENTS

| | | |
|---|---|---|
| 2010/0207185 A1 | 8/2010 | Lee et al. |
| 2011/0065270 A1 | 3/2011 | Shim et al. |
| 2012/0098050 A1 | 4/2012 | Shim et al. |
| 2013/0134492 A1 | 5/2013 | Yang et al. |
| 2016/0190155 A1 | 6/2016 | Lee et al. |
| 2017/0062454 A1 | 3/2017 | Lu et al. |
| 2018/0097009 A1* | 4/2018 | Zhang ............... H10B 43/40 |
| 2019/0378852 A1 | 12/2019 | Baek et al. |

FOREIGN PATENT DOCUMENTS

| | | |
|---|---|---|
| KR | 1020130005434 A | 1/2013 |
| KR | 1020170043420 A | 4/2017 |
| KR | 101736982 B1 | 5/2017 |
| KR | 1020170136363 A | 12/2017 |

\* cited by examiner

FIG. 8A
FIG. 8B
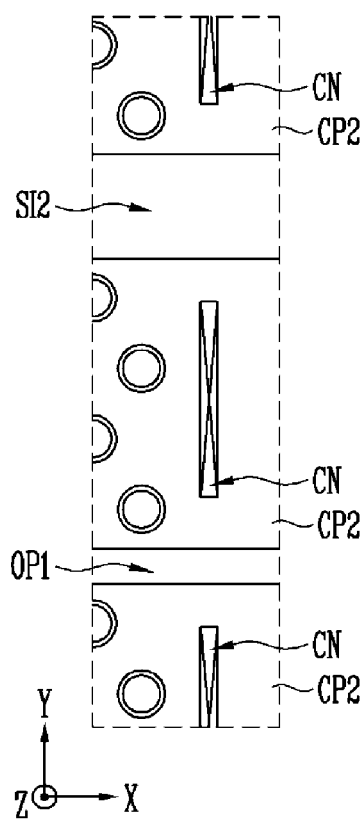
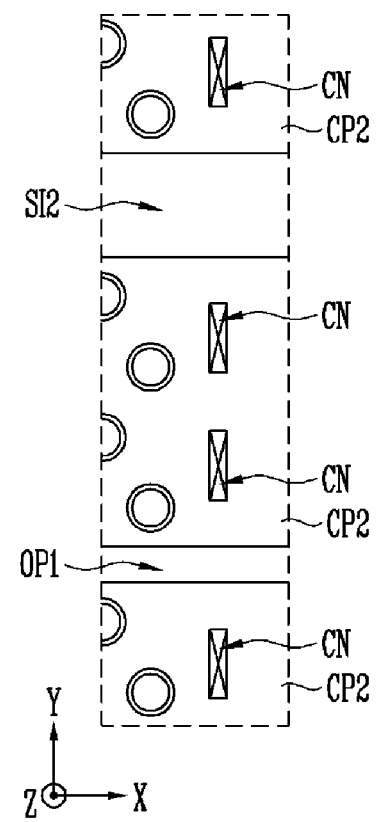

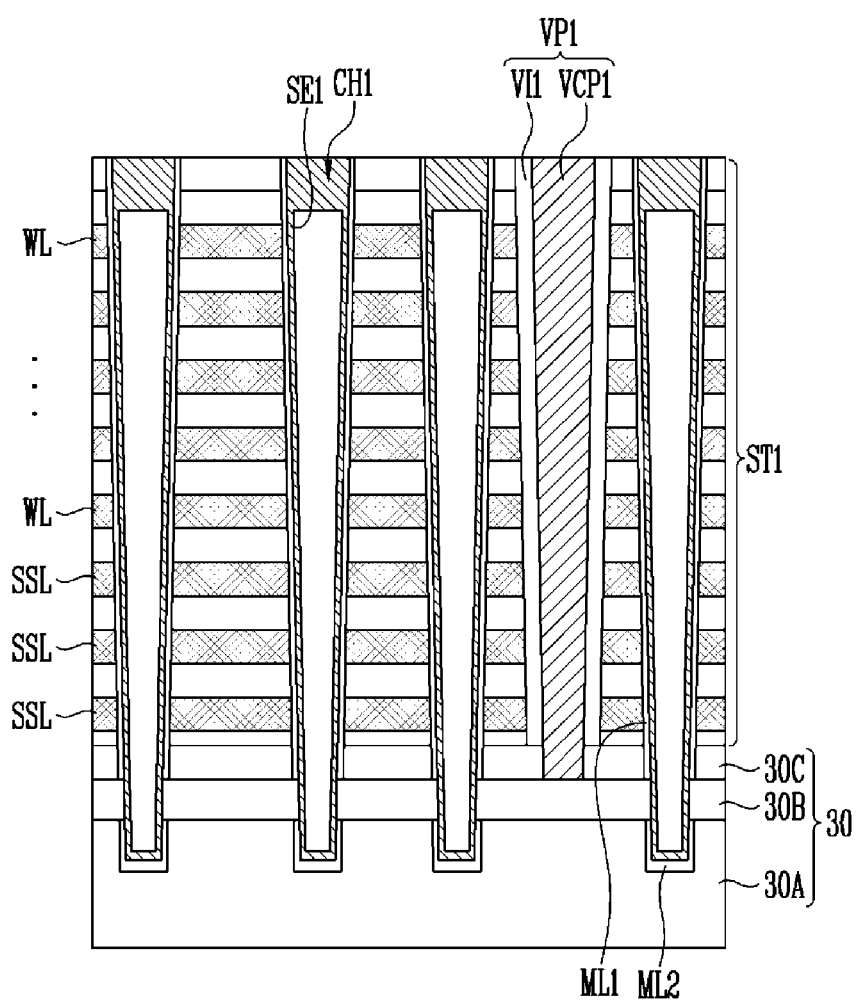

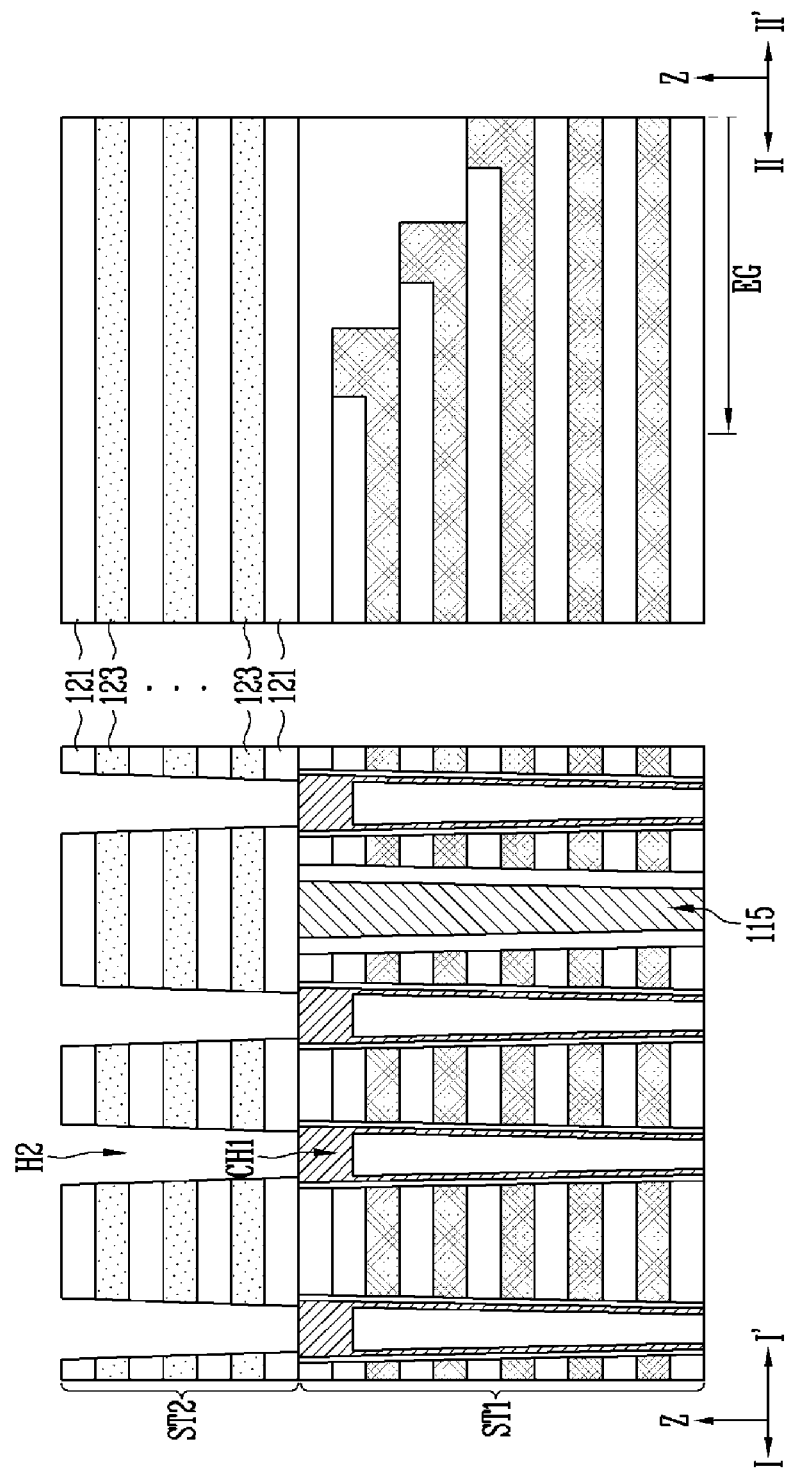

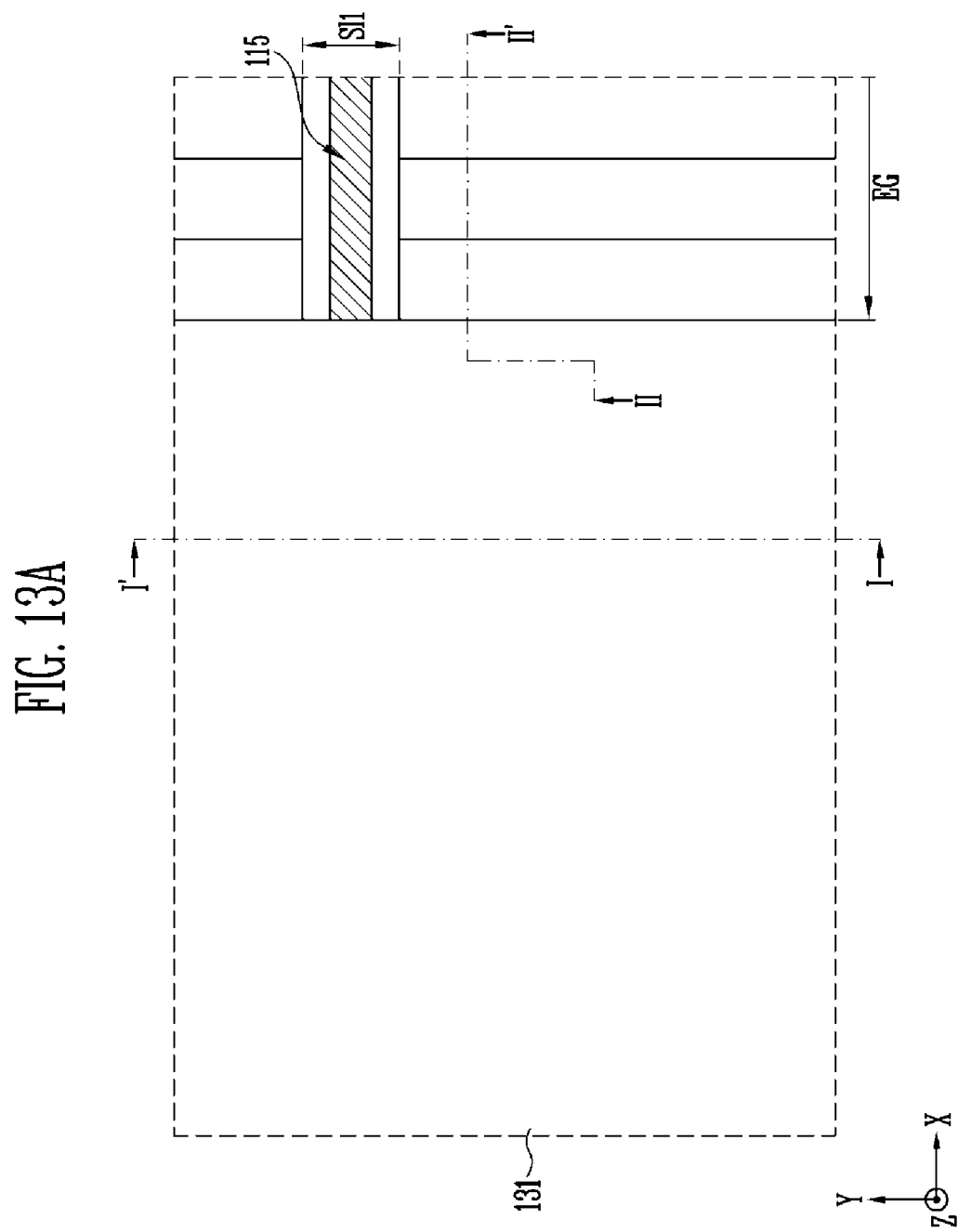

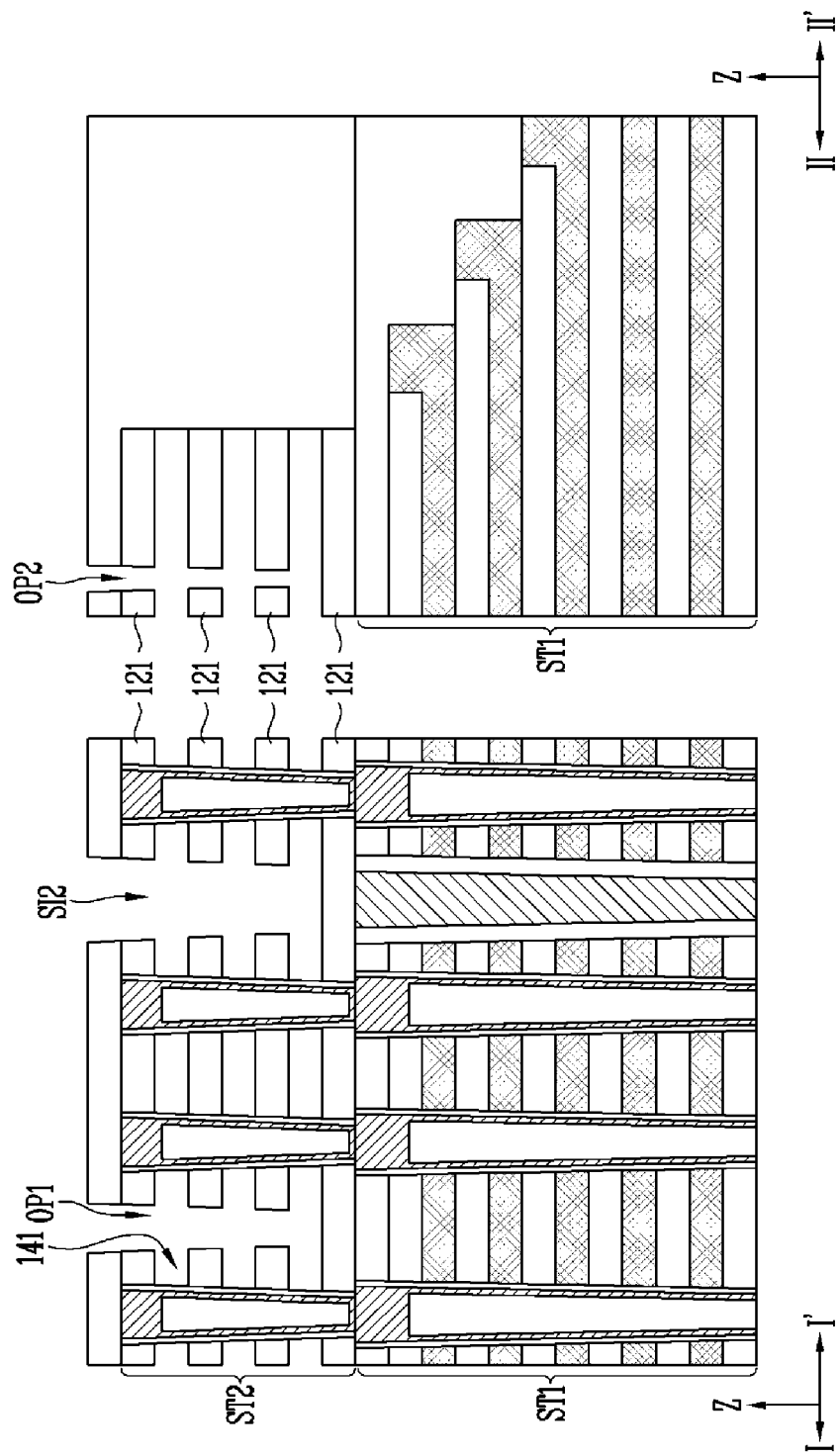

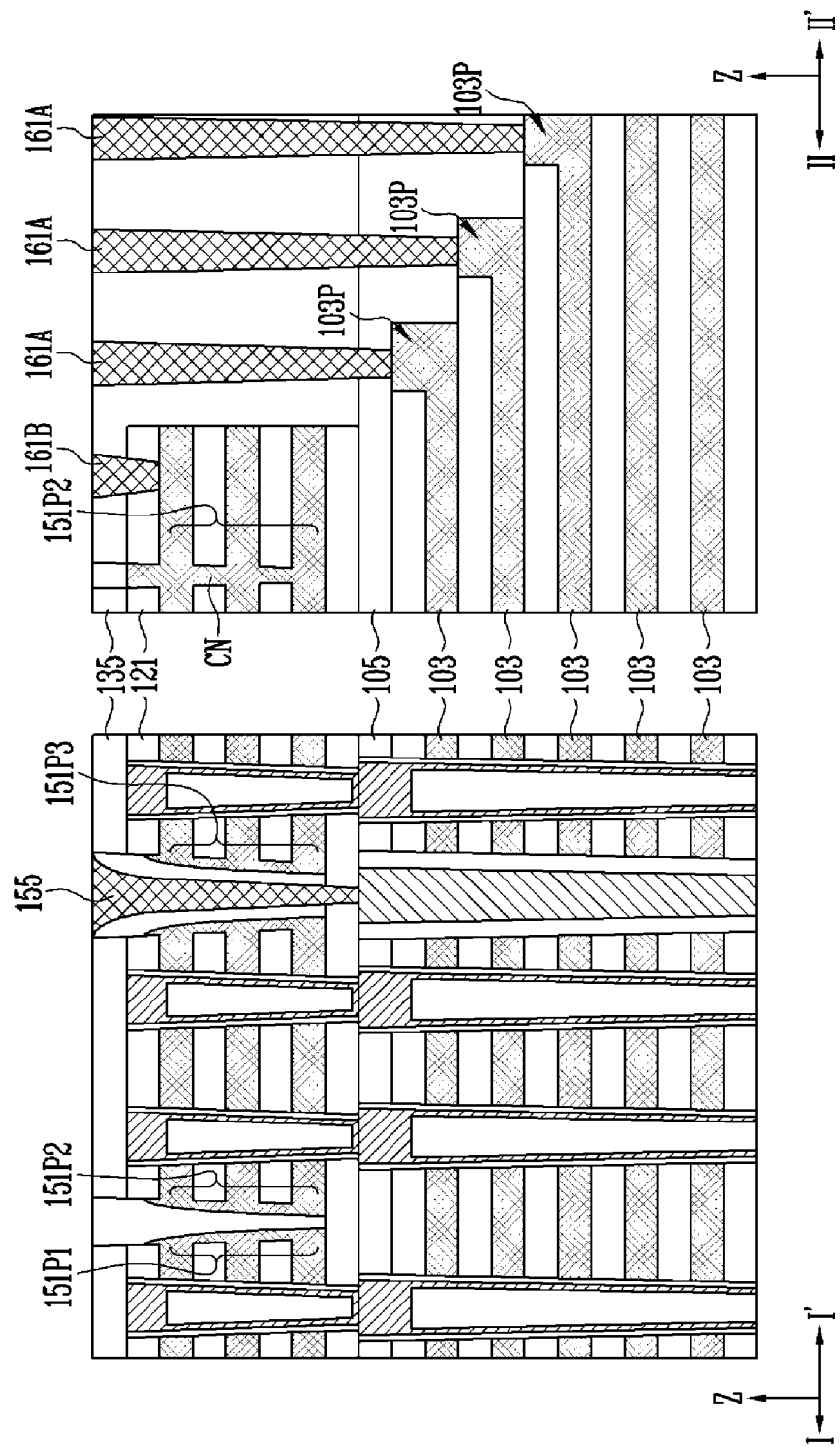

SEMICONDUCTOR DEVICE AND MANUFACTURING METHOD OF THE SEMICONDUCTOR DEVICE

CROSS-REFERENCE TO RELATED APPLICATION

The present application is a continuation application of U.S. patent application Ser. No. 17/549,456, filed on Dec. 13, 2021, which is a continuation application of U.S. patent application Ser. No. 16/387,218, filed on Apr. 17, 2019, and claims priority under 35 U.S.C. § 119(a) to Korean patent application number 10-2018-0117861, filed on Oct. 2, 2018, in the Korean Intellectual Property Office, the entire disclosure of which is incorporated herein by reference.

BACKGROUND

1. Technical Field

Various embodiments generally relate to a semiconductor device and a method of manufacturing the semiconductor device, and more particularly, to a three-dimensional semiconductor memory device and a method of manufacturing the three-dimensional semiconductor device.

2. Related Art

A semiconductor device may include a memory cell array including a plurality of memory cells. The memory cell array may include the plurality of memory cells. The memory cells may be arranged in three dimensions on a substrate to improve integration density of the semiconductor device.

When manufacturing the memory cells arranged in three dimensions, various technologies for lowering a level of difficulty of a manufacturing process are being developed.

SUMMARY

According to an embodiment, a semiconductor device may include a first stack structure including first interlayer insulating layers and first conductive patterns alternately stacked on each other in a first direction, first channel structures passing through the first stack structure, second channel structures coupled to the first channel structures in a one-to-one manner, and second conductive patterns surrounding the second channel structures, the second conductive patterns separated from each other and located above the first stack structure. Each of the second conductive patterns comprises electrode portions stacked in the first direction, and at least one connecting portion extending in the first direction to couple the electrode portions.

According to an embodiment, a method of manufacturing a semiconductor device may include forming a first stack structure including first interlayer insulating layers and first conductive patterns which are alternately stacked on each other, and penetrated by first channel structures, forming a second stack structure including second interlayer insulating layers and sacrificial layers which enclose second channel structures coupled to the first channel structures and which are alternately stacked on each other, on the first stack structure, forming at least one first opening and at least one second opening which expose the sacrificial layers by etching the second stack structure, replacing each of the sacrificial layers with a conductive material through the first opening and the second opening, and forming second conductive patterns separated from each other through the first opening by etching the conductive material to expose a bottom surface of the first opening such that the second opening is filled with one second conductive pattern among the second conductive patterns.

According to an embodiment, a method of manufacturing a semiconductor device may include forming first stack structures separated from each other by a first slit and including first interlayer insulating layers and first conductive patterns which enclose first channel structures, respectively, and alternately stacked on each other, forming a first vertical conductive pattern having a sidewall covered by a first slit insulating layer in the first slit, forming a second stack structure including second interlayer insulating layers and sacrificial layers which enclose second channel structures coupled to the first channel structures and which are alternately stacked on each other, and exposing an end portion of each of the first stack structures, on the first stack structures, forming a second slit by etching a first region of the second stack structure which overlaps the first slit, and forming a second vertical conductive pattern having a sidewall covered by a second slit insulating layer and extending to be coupled to the first vertical conductive pattern, in the second slit.

BRIEF DESCRIPTION OF THE DRAWINGS

FIGS. 8A and 8B are plan views illustrating examples of variations of a connecting portion according to an embodiment;

FIGS. 9A to 9C are cross-sectional diagrams illustrating various lower structures disposed under a first stack structure according to an embodiment;

FIGS. 11, 12A, 12B, 13A, 13B, and 14A to 14H are diagrams illustrating a manufacturing method of a semiconductor device according to an embodiment;

DETAILED DESCRIPTION

The technical spirit of the present disclosure may include examples of embodiments to which various modifications and changes may be applied and which include various forms. Hereinafter, embodiments of the present disclosure will be described in order for those skilled in the art to which the present disclosure pertains to be able to readily implement the technical spirit of the present disclosure.

While terms such as "first" and "second" may be used to describe various components, such components must not be understood as being limited to the above terms. The above terminologies are used to distinguish one component from the other component, for example, a first component may be referred to as a second component without departing from a scope in accordance with the concept of the present disclosure and similarly, a second component may be referred to as a first component.

It will be understood that when an element is referred to as being "connected" or "coupled" to another element, it can be directly connected or coupled to the other element or intervening elements may also be present. In contrast, when an element is referred to as being "directly connected" or "directly coupled" to another element, no intervening elements are present. Meanwhile, other expressions describing relationships between components such as " . . . between," "immediately . . . between" or "adjacent to . . . " and "directly adjacent to . . . " may be construed similarly.

The terms used in the present application are merely used to describe particular embodiments, and are not intended to limit the present disclosure. Singular forms in the present disclosure are intended to include plural forms as well, unless the context clearly indicates otherwise. In the present specification, it should be understood that terms "include" or "have" indicate that a feature, a number, a step, an operation, a component, a part or the combination those of described in the specification is present, but do not exclude a possibility of presence or addition of one or more other features, numbers, steps, operations, components, parts or combinations thereof, in advance.

Various embodiments may be directed to a semiconductor device capable of lowering a level of difficulty of a manufacturing process of a semiconductor device and a manufacturing method of the semiconductor device.

Figure 1A:
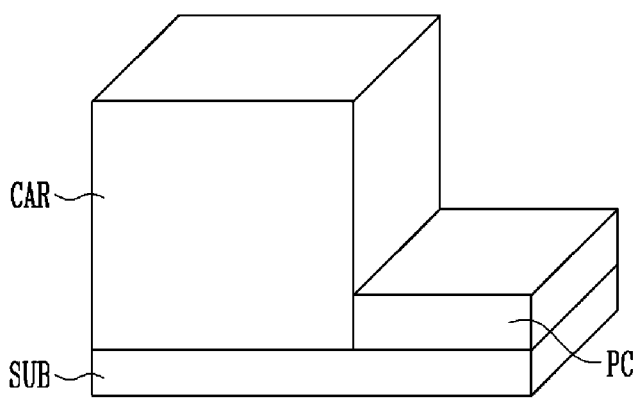
FIGS. 1A and 1B are block diagrams schematically illustrating semiconductor devices according to embodiments.
Figure 1B:
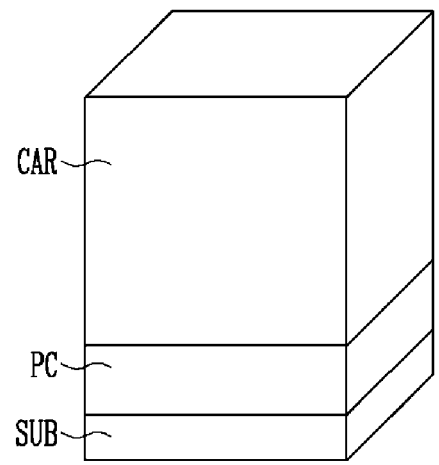

FIGS. 1A and 1B are block diagrams schematically illustrating semiconductor devices according to embodiments.

Referring to FIGS. 1A and 1B, each of semiconductor devices according to embodiments may include a peripheral circuit structure PC and a cell array CAR disposed above a substrate SUB.

The substrate SUB may be a single crystal semiconductor layer. For example, the substrate SUB may be a bulk silicon substrate, a silicon-on-insulator substrate, a germanium substrate, a germanium-on-insulator substrate, a silicon-germanium substrate, or an epitaxial thin film formed by a selective epitaxial growth method.

The cell array CAR may include a plurality of memory blocks. Each of the memory blocks may include a plurality of cell strings. Each of the cell strings may be electrically coupled to a bit line, a source line, word lines and select lines. Each of the cell strings may include memory cells and select transistors coupled in series. Each of the select lines may serve as a gate electrode of a corresponding select transistor, and each of the word lines may serve as a gate electrode of a corresponding memory cell.

The peripheral circuit structure PC may include NMOS transistors, PMOS transistors, a resistor, and a capacitor which are electrically coupled to the cell array CAR. The NMOS and PMOS transistors, the resistor, and the capacitor may serve as devices which constitute a row decoder, a column decoder, a page buffer and a control circuit.

As illustrated in FIG. 1A, the peripheral circuit structure PC may be disposed on a portion of the substrate SUB which is not overlapped with the cell array CAR.

Alternatively, as illustrated in FIG. 1B, the peripheral circuit structure PC may be disposed between the cell array CAR and the substrate SUB. Since the peripheral circuit structure PC overlaps the cell array CAR, an area of the substrate SUB which is occupied by the cell array CAR region and the peripheral circuit structure PC may be decreased.

Figure 2:
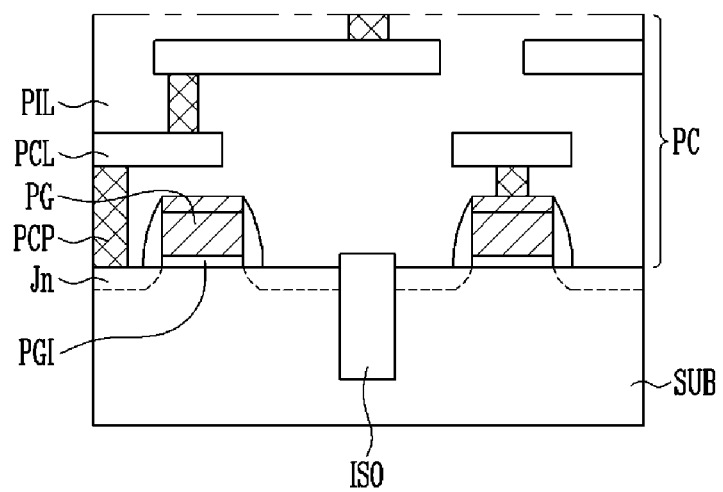
FIG. 2 is a cross-sectional diagram schematically illustrating a peripheral circuit structure.

FIG. 2 is a cross-sectional diagram schematically illustrating the peripheral circuit structure PC. The peripheral circuit structure PC shown in FIG. 2 may be included in the peripheral circuit structure PC shown in FIG. 1A or the peripheral circuit structure PC shown in FIG. 1B.

Referring to FIG. 2, the peripheral circuit structure PC may include peripheral gate electrodes PG, a peripheral gate insulating layer PGI, junctions Jn, peripheral circuit wires PCL, peripheral contact plugs PCP, and a peripheral circuit insulating layer PIL.

The peripheral gate electrodes PG may serve as gate electrodes of the NMOS transistor and the PMOS transistor of the peripheral circuit structure PC, respectively. The peripheral gate insulating layer PGI may be disposed between each of the peripheral gate electrodes PG and the substrate SUB.

The junctions Jn may be a region defined by injecting an n-type or p-type dopant into an active region of the substrate SUB. The junctions Jn may be disposed at both sides of each of the peripheral gate electrodes PG and serve as a source junction or a drain junction, respectively. The active region of the substrate SUB may be divided by an isolation layer ISO formed in the substrate SUB. The isolation layer ISO may include an insulating material.

The peripheral circuit wires PCL may be electrically coupled to a circuit of the peripheral circuit structure PC through the peripheral contact plugs PCP.

The peripheral circuit insulating layer PIL may cover the circuit of the peripheral circuit structure PC, the peripheral circuit wires PCL, and the peripheral contact plugs PCP. The peripheral circuit insulating layer PIL may include insulating layers stacked in multiple layers.

Figure 3A:
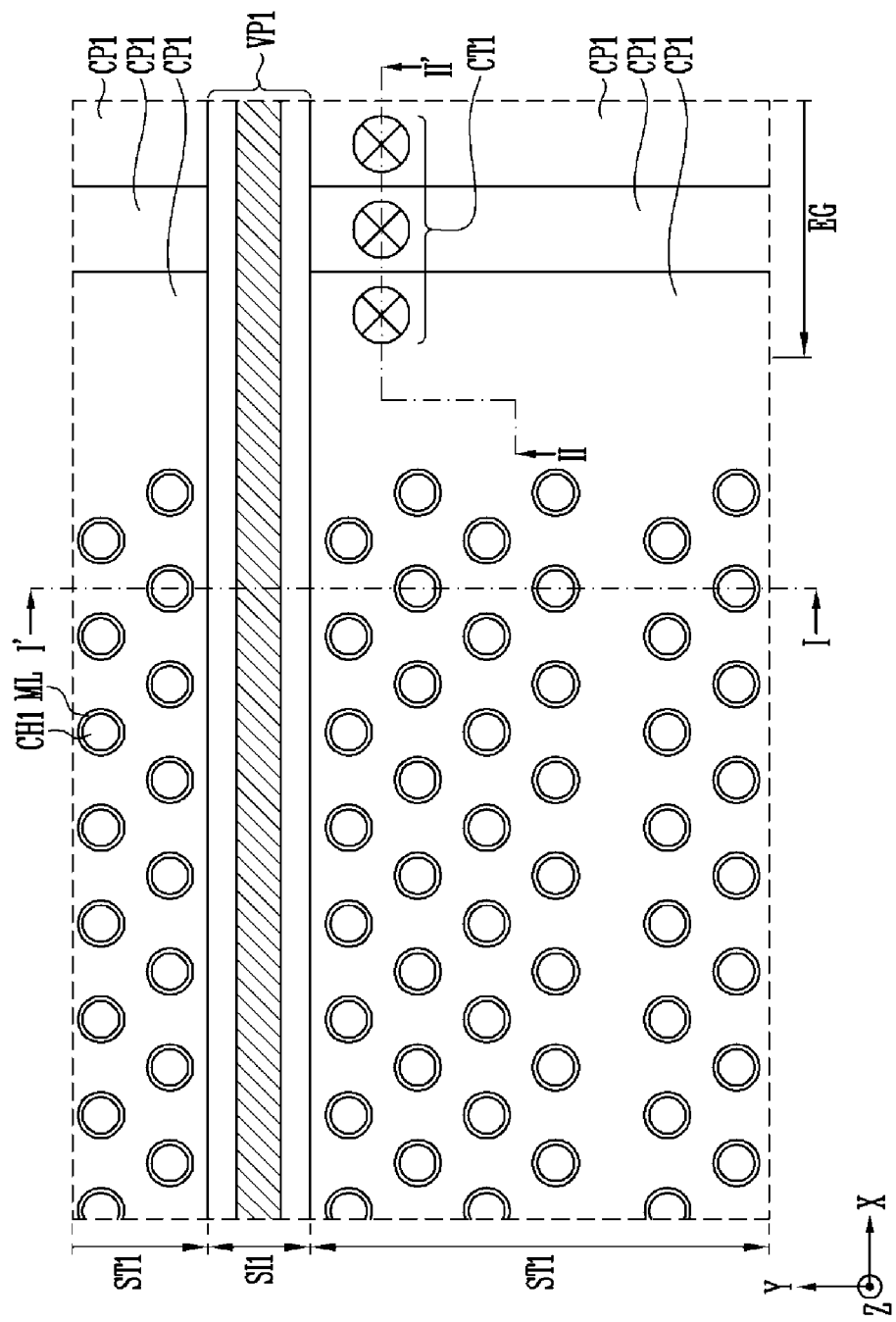
FIGS. 3A and 3B are plan views illustrating a layout of a semiconductor device according to an embodiment.
Figure 3B:
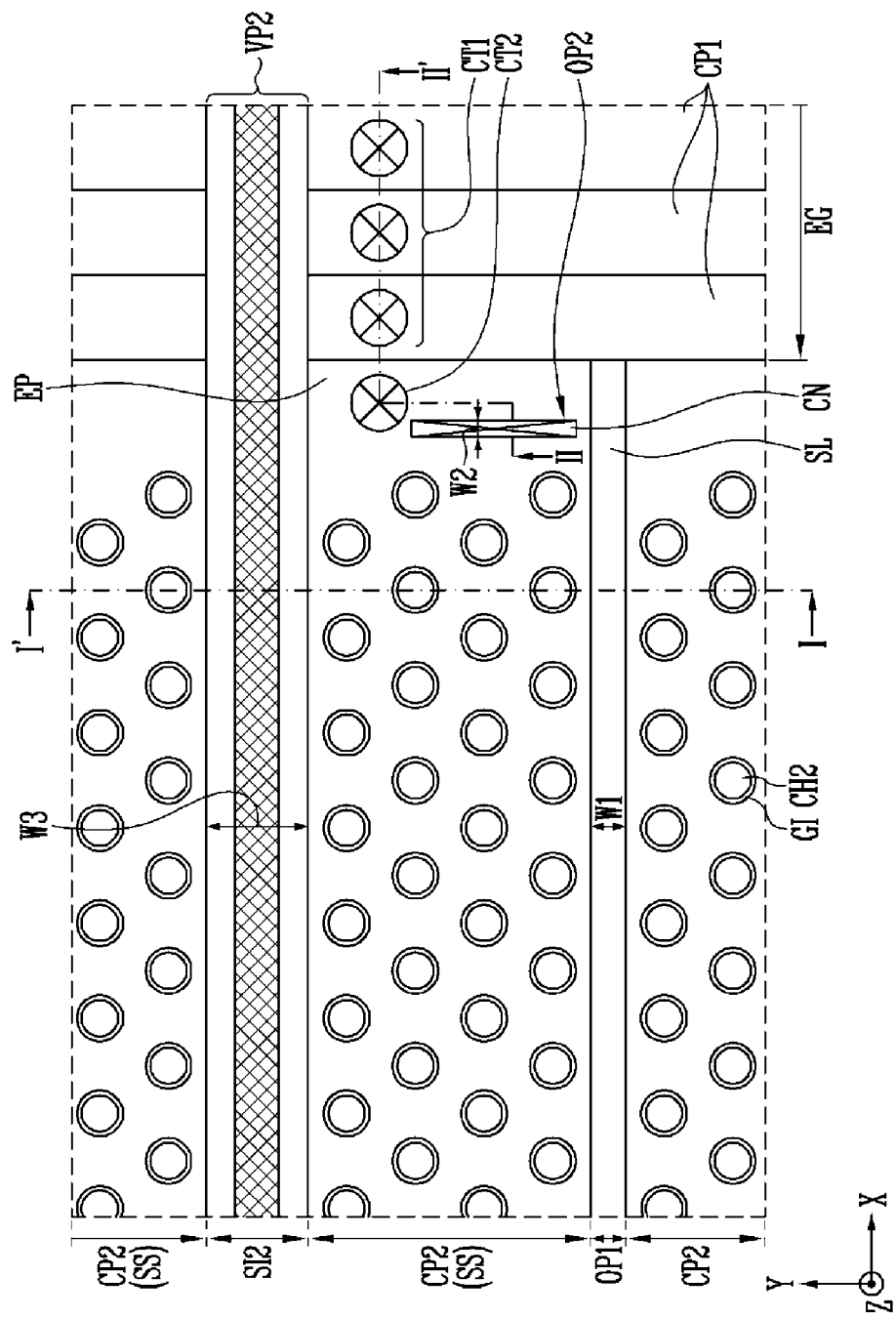

FIGS. 3A and 3B are plan views illustrating a layout of a semiconductor device according to an embodiment. For example, FIG. 3A is a plan view illustrating a layout of first conductive patterns CP1 and FIG. 3B is a plan view illustrating a layout of second conductive patterns CP2. Structures illustrated in FIGS. 3A and 3B, respectively, may be included in the cell array CAR shown in FIG. 1A or 1B.

Referring to FIG. 3A, a semiconductor device according to an embodiment may include first stack structures ST1 separated from each other by a first slit SI1. Each of the first stack structures ST1 may include the first conductive patterns CP1 stacked to be spaced apart from each other in a first direction Z. An end portion EG of each of the first stack structures ST1 may include end portions of the first conductive patterns CP1 patterned into a stepped structure.

The first slit SI1 may extend a first horizontal direction X intersecting the first direction Z. The first slit SI1 may be filled with a first vertical structure VP1. The first stack structures ST1 may be arranged to be spaced apart from each other in a second horizontal direction Y. The first slit SI1 and the first vertical structure VP1 may be disposed between the first stack structures ST1 neighboring each other in the second horizontal direction Y. The second horizontal direction Y may intersect the first direction Z and the first horizontal direction X.

The first conductive patterns CP1 may be stacked in the first direction Z to form a stepped structure at the end portion EG of each of the first stack structures ST1. Each of the first conductive patterns CP1 may extend in the first horizontal direction X and the second horizontal direction Y. The first conductive patterns CP1 included in each of the first stack structures ST1 may extend to have different lengths from each other in the first horizontal direction X and may form a stepped structure. The end portions of the first conductive patterns CP1 may be exposed through the stepped structure.

The end portions of the first conductive patterns CP1 which are exposed through the stepped structure may be coupled to first contact plugs CT1. The first contact plugs CT1 may be disposed on the end portion EG of each of the first stack structures ST1. The first contact plugs CT1 may be arranged in a line in the first horizontal direction X at the end portion EG of each of the first stack structures ST1. However, the embodiments are not limited thereto. According to an embodiment, the first contact plugs CT1 may be arranged in a zigzag format at the end portion EG of each of the first stack structures ST1.

Each of the first stack structures ST1 may be penetrated by first channel structures CH1. The first channel structures CH1 may be surrounded with the first conductive patterns CP1. The first channel structures CH1 passing through each of the first stack structures ST1 may be arranged in a plurality of columns and a plurality of rows. The first channel structures CH1 may be disposed in a zigzag format. However, the embodiments are not limited thereto. According to an embodiment, the first channel structures CH1 may be arranged parallel with each other in the first horizontal direction X and the second horizontal direction Y. A multilayer ML may be disposed between each of the first channel structures CH1 and each of the first conductive patterns CP1.

Referring to FIG. 3B, a semiconductor device according to an embodiment may include the second conductive patterns CP2. The second conductive patterns CP2 may be disposed on the first stack structures ST1 shown in FIG. 3A. Each of the second conductive patterns CP2 may expose the end portion EG of each of the first stack structures ST1 shown in FIG. 3A. In other words, the end portions of the first conductive patterns CP1 may extend farther in the first horizontal direction X than the second conductive patterns CP2.

A second slit SI2 may overlap the first slit SI1 shown in FIG. 3A. At least one first opening OP1 may overlap each of the first stack structures ST1 shown in FIG. 3A. The second slit SI2 may extend in the first horizontal direction X. The second slit SI2 may be filled with a second vertical structure VP2. The first opening OP1 may extend in the first horizontal direction X. The first opening OP1 may be filled with a separation insulating layer SL. The first opening OP1 and the separation insulating layer SL may have a linear shape extending in the first horizontal direction X. However, the embodiments are not limited thereto. According to an embodiment, the first opening OP1 and the separation insulating layer SL may have a wave shape or a zigzag format which extends in the first horizontal direction X.

The second conductive patterns CP2 may be arranged to be spaced apart from each other in the second horizontal direction Y. The second conductive patterns CP2 may be separated from each other by the second slit SI2 or the separation insulating layer SL filling the first opening OP1. In an embodiment, a distance of the separation between the second conductive patterns CP2 adjacent to each other (i.e., caused by the second slit SI2 or the separation insulation layer SL filling the first opening OP1) may each be greater than a width of the connecting portion CN discussed with relation to FIGS. 4A and 4B below. The number of first openings OP1 overlapping each of the first stack structures ST1 shown in FIG. 3A may be variously set depending on the number of second conductive patterns CP2 separated from each other above each of the first stack structure ST1. The number of second conductive patterns CP2 disposed to be separated from each other above each of the first stack structures ST1 may be 2 or more.

The second conductive patterns CP2 may include a slit side pattern SS. The slit side pattern SS is one among the second conductive patterns CP2 and may be adjacent to the second slit SI2 and the second vertical structure VP2. Each of the second conductive patterns CP2 may fill a second opening OP2. Each of the second conductive patterns CP2 may be penetrated by second channel structures CH2.

The second channel structures CH2 may be coupled to the first channel structures CH1 shown in FIG. 3A, respectively. In an embodiment, the second channel structures CH2 may be coupled to the first channel structures CH1 in a one-to-one manner whereby a single first channel structure CH1 is coupled with a single overlapping second channel structure CH2. Each of the second conductive patterns CP2 may enclose at least one column of the second channel structures CH2. Each of the second conductive patterns CP2 may enclose the second channel structures CH2 disposed in a plurality of columns and a plurality of rows. The second channel structures CH2 may be disposed in a zigzag format. However, the embodiments are not limited thereto. According to an embodiment, the second channel structures CH2 may be arranged parallel with each other in the first horizontal direction X and the second horizontal direction Y. A gate insulating layer GI may be disposed between each of the second channel structures CH2 and each of the second conductive patterns CP2.

Each of the second conductive patterns CP2 may include electrode portions EP and a connecting portion CN. The electrode portions EP of each of the second conductive patterns CP2 may extend in the first horizontal direction X and the second horizontal direction Y, and may be stacked in the first direction Z. The connecting portion CN may fill the second opening OP2. The connecting portion CN may be surrounded with the electrode portions EP between the second channel structures CH2 and the first contact plugs CT1.

A first width W1 of the first opening OP1, a second width W2 of the second opening OP2, and a third width W3 of the second slit SI2 may be different from each other. Each of the first width W1, the second width W2, and the third width W3 may be measured in a transverse direction but not in a longitudinal direction and may be defined by a value measured on a horizontal plane. The first width W1 and the third width W3 may be measured in the second horizontal direction Y, and the second width W2 may be measured in the first horizontal direction X. A direction in which the second width W2 is measured may be variously changed according to a shape of the second opening OP2. The second width W2 may be smaller than the first width W1 (W2<W1). In other words, a width of the connecting portion CN may be smaller than a width between the second conductive patterns CP2 neighboring each other. The second width W2 may be smaller than the third width W3 (W2<W3). The first width W1 may be smaller than the third width W3 (W1<W3).

An end portion of each of the second conductive patterns CP2 may be coupled to a second contact plug CT2. The second contact plug CT2 and the first contact plugs CT1 may be arranged in a line in the first horizontal direction X.

However, the embodiments are not limited thereto. According to an embodiment, the second contact plug CT2 and the first contact plugs CT1 may be arranged in a zigzag format.

Figure 4A:
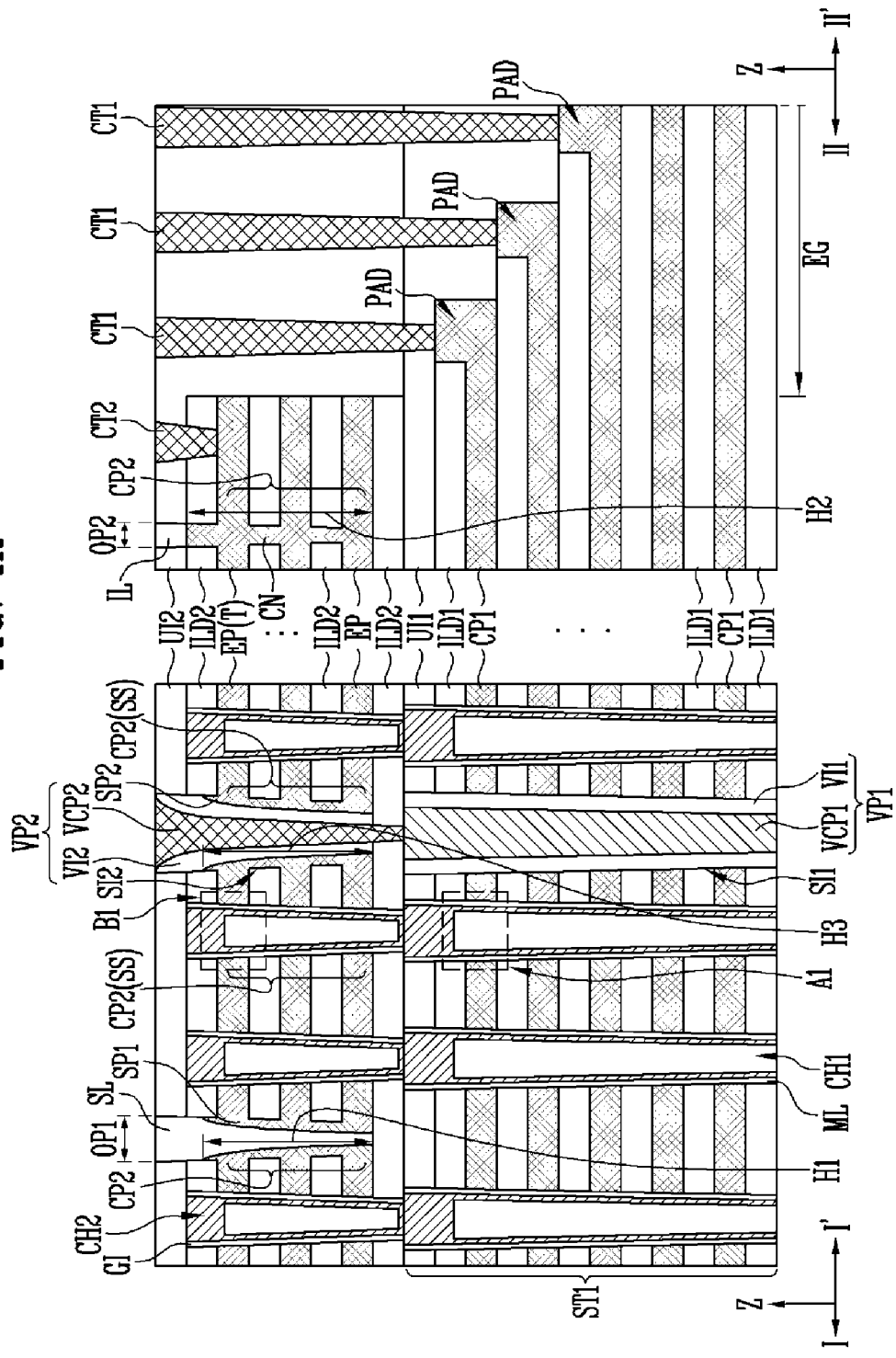
FIGS. 4A and 4B are diagrams illustrating various cross sections of a semiconductor device according to embodiments.
Figure 4B:
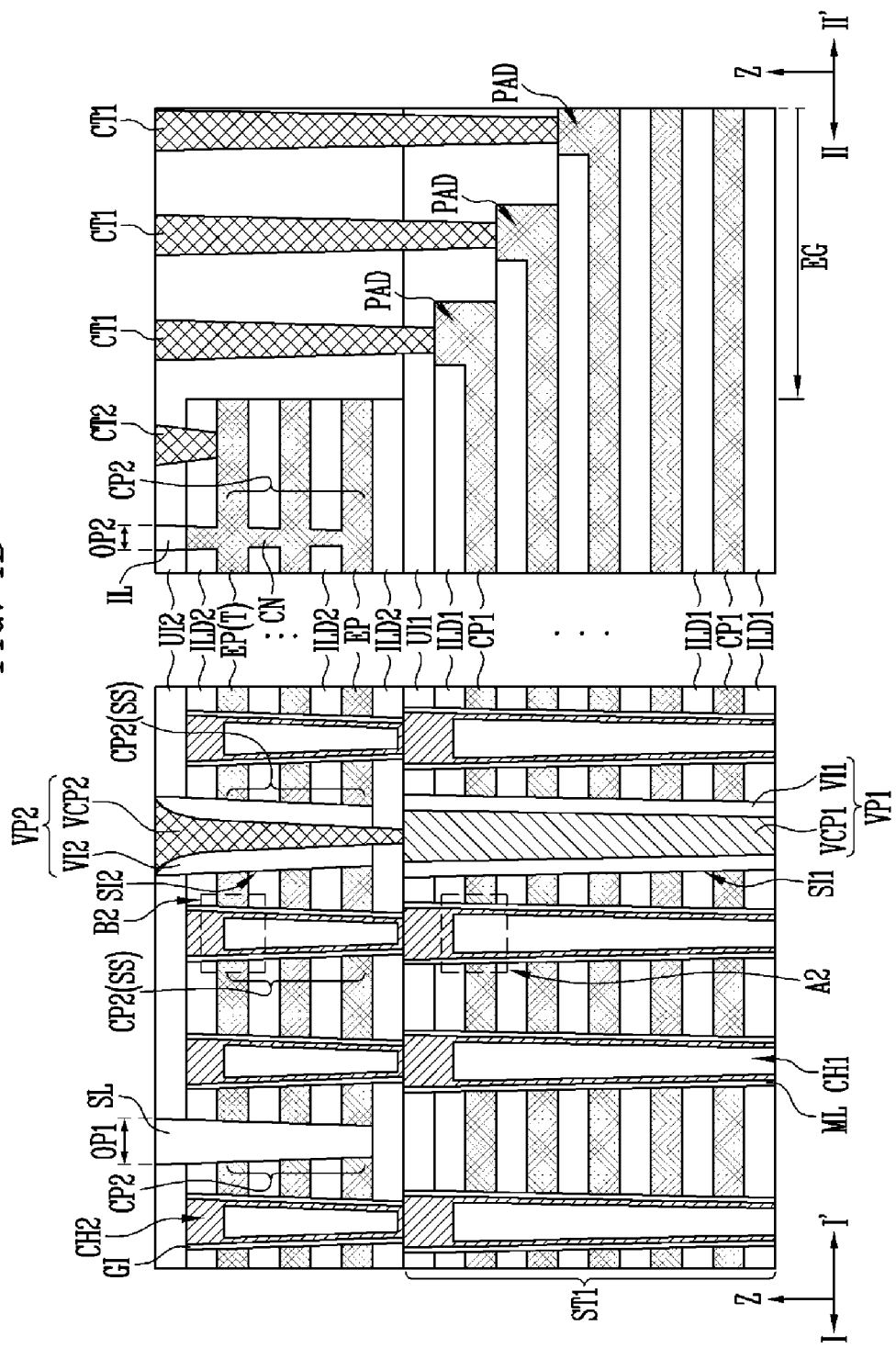

FIGS. 4A and 4B are diagrams illustrating various cross sections of a semiconductor device according to an embodiment. For example, FIGS. 4A and 4B illustrate various cross sections taken along lines I-I' and II-II' shown in each of FIGS. 3A and 3B. Each of structures shown in FIGS. 4A and 4B may be included in the cell array CAR shown in FIG. 1A or 1B.

Referring to FIGS. 4A and 4B, each of the first stack structures ST1 may include first interlayer insulating layers ILD1 disposed between the first conductive patterns CP1 neighboring in the first direction Z. In other words, each of the first stack structures ST1 may include the first interlayer insulating layers ILD1 and the first conductive patterns CP1 alternately stacked on each other in the first direction Z.

Each of the first conductive patterns CP1 may include at least one of a silicon layer, a metal silicide layer, a metal layer, and a metal nitride layer. Each of the first conductive patterns CP1 may include metal such as tungsten (W), cobalt (Co), and ruthenium (Ru) for low resistance wiring. A barrier pattern that prevents direct contact between the first interlayer insulating layers ILD1 and the first conductive patterns CP1 may be further formed.

The end portion of each of the first conductive patterns CP1 may include a pad portion PAD protruding in the first direction Z. Each of the first contact plugs CT1 may be coupled to the corresponding pad portion PAD. The first contact plugs CT1 may contact the end portions of the first conductive patterns CP1, and extend in the first direction Z. In an embodiment, the first contact plugs CT1 may be coupled to a pad portion PAD in a one-to-one manner whereby a single first contact plug CT1 is coupled with a single pad portion PAD. In an embodiment, the first contact plugs CT1 may be coupled to the first conductive patterns CP1 in a one-to-one manner whereby a single first contact plug CT1 is coupled with a single first conductive pattern CP1. In an embodiment, the first conductive patterns CP1 are stacked to form a stepped structure and the first contact plugs CT1 are coupled to end portions of the first conductive patterns CP1 which are exposed through the stepped structure in a one-to-one manner whereby a single first contact plug CT1 is coupled to an end portion of a single first conductive pattern CP1 which is exposed through the stepped structure.

The first interlayer insulating layers ILD1 may include various insulating materials. For example, the first interlayer insulating layers ILD1 may include a silicon oxide layer.

Each of the first stack structures ST1 may further include a first upper insulating layer UI1 covering the end portions of the first conductive patterns CP1. A surface of the first upper insulating layer UI1 may be flat. The first upper insulating layer UI1 may be a single layer or include multiple layers. According to an embodiment, the first upper insulating layer UI1 may include an oxide layer. According to an embodiment, the first upper insulating layer UI1 may include a stacked structure of an oxide layer and an etch stop layer. A nitride layer may serve as an etch stop layer.

Each of the first channel structures CH1 surrounded with the first interlayer insulating layers ILD1 and the first conductive patterns CP1 may extend in the first direction Z to pass through the first upper insulating layer UI1. The multilayers ML may be disposed between the first channel structures CH1 and the first conductive patterns CP1. Each of the multilayers ML may extend along an outer wall of the corresponding first channel structure CH1. However, the embodiments are not limited thereto. According to an embodiment, the multilayers ML may extend along interfaces between the first conductive patterns CP1 and the first interlayer insulating layers ILD1, and interfaces between the first channel structures CH1 and the first conductive patterns CP1.

The first vertical structure VP1 may include a first slit insulating layer VI1 and a first vertical conductive pattern VCP1. The first slit insulating layer VI1 may be formed on a sidewall of the first slit SI1 to cover a sidewall of each of the first stack structures ST1. The first vertical conductive pattern VCP1 may be formed on a sidewall of the first slit insulating layer VI1. The first vertical conductive pattern VCP1 may be insulated from the first conductive patterns CP1 by the first slit insulating layer VI1. The first slit insulating layer VI1 and the first vertical conductive pattern VCP1 may extend in the first direction Z. The first slit insulating layer VI1 and the first vertical conductive pattern VCP1 may be a linear shape extending in the first horizontal direction X as shown in FIG. 3A. The first slit insulating layer VI1 may include an oxide layer. The first vertical conductive pattern VCP1 may at least include a doped semiconductor layer. The doped semiconductor layer included in the first vertical conductive pattern VCP1 may include an n-type impurity. According to an embodiment, the first vertical conductive pattern VCP1 may include an n-type doped silicon layer.

The second conductive patterns CP2 separated from each other may be disposed above each of the first stack structures ST1. The second conductive patterns CP2 may include the slit side patterns SS disposed above different first stack structures ST1, neighboring each other, and separated from each other by the second slit SI2. The slit side patterns SS may be the second conductive patterns CP2 disposed adjacent to the first vertical structure VP1. The second conductive patterns CP2 disposed on the same first stack structure ST1 and neighboring each other may be separated from each other by the separation insulating layer SL filling the first opening OP1.

Each of the second conductive patterns CP2 may include the electrode portions EP stacked in the first direction Z and the connecting portion CN coupled in common to the electrode portions EP. The electrode portions EP and the connecting portion CN of each of the second conductive patterns CP2 may be integrated and may include the same conductive material. In an embodiment, each of the connecting portion CN may include a metal such as, but not limited to, at least one of tungsten (W), cobalt (Co), and ruthenium (Ru).

Each of the electrode portions EP may be disposed between second interlayer insulating layers ILD2 neighboring each other in the first direction Z. In other words, the electrode portions EP and the second interlayer insulating layers ILD2 may be alternately stacked on each other above the first stack structures ST1. The second interlayer insulating layers ILD2 may enclose the connecting portion CN. The electrode portions EP and the second interlayer insulating layers ILD2 may expose the end portion EG of each of the first stack structures ST1.

A stacked structure of the electrode portions EP and the second interlayer insulating layers ILD2 and the end portion EG of each of the first stack structures ST1 may be covered by a second upper insulating layer UI2. A surface of the second upper insulating layer UI2 may be flat. According to an embodiment, the second upper insulating layer UI2 may include an oxide layer.

The second slit SI2, the first opening OP1 and the second opening OP2 may pass through at least middle patterns among the second interlayer insulating layers ILD2. The middle patterns may be defined as the second interlayer insulating layers disposed between the electrode portions EP neighboring in the first direction Z. The second slit SI2, the first opening OP1, and the second opening OP2 may further pass through the second upper insulating layer UI2.

The first opening OP1 may be filled with the separation insulating layer SL. First spacer electrodes SP1 may be further formed on sidewalls of the second conductive patterns CP2 facing the separation insulating layer SL as shown in FIG. 4A. The first spacer electrodes SP1 may be omitted as shown in FIG. 4B. The first spacer electrodes SP1 may be included in each of the second conductive patterns CP2. The first spacer electrode SP1, the connecting portion CN, and the electrode portions EP of each of the second conductive patterns CP2 may be integrated with each other and may include the same conductive material. The first spacer electrodes SP1 may have a smaller height than the connecting portion CN (H1<H2). The first spacer electrodes SP1 may protrude farther in the first direction Z than the uppermost electrode portion T among the electrode portions EP. In an embodiment, first spacer electrodes SP1 may be formed on opposite side walls of a second conductive pattern CP2 and may be spaced apart from each other.

The separation insulating layer SL may completely fill a space between the second conductive patterns CP2 neighboring each other with the first opening OP1 interposed therebetween. For example, the separation insulating layer SL may completely fill a space between the first spacer electrodes SP1 neighboring each other as shown in FIG. 4A, or may completely fill the first opening OP1 as shown in FIG. 4B. The separation insulating layer SL may include an oxide layer. The first conductive patterns CP1 of each of the first stack structures ST1 may be coupled under the separation insulating layer SL and the first opening OP1.

The second opening OP2 may be filled with the connecting portion CN. The connecting portion CN may have a smaller height than the second opening OP2. An upper end of the second opening OP2 which is exposed by the connecting portion CN may be filled with an upper insulating pattern IL. The upper insulating pattern IL may include an oxide layer. The second opening OP2 and the connecting portion CN may extend in the first direction Z. The connecting portion CN may protrude farther in the first direction Z than the uppermost electrode portion T.

The second slit SI2 may overlap with the first slit SI1. The second slit SI2 may be filled with the second vertical structure VP2. Second spacer electrodes SP2 may be further formed on sidewalls of the second slit SI2 as shown in FIG. 4A. The second spacer electrodes SP2 may be omitted as shown in FIG. 4B. The second spacer electrodes SP2 may be included in each of the slit side patterns SS. The second spacer electrode SP2, the connecting portion CN, and the electrode portions EP of each of the slit side patterns SS may be integrated with each other and may include the same conductive material. The second spacer electrodes SP2 may have a smaller height than the connecting portion CN (H3<H2). The second spacer electrodes SP2 may protrude farther in the first direction Z than the uppermost electrode portion T. In an embodiment, second spacer electrodes SP2 may be formed on opposite side walls of a second conductive pattern CP2 and may be spaced apart from each other.

The first spacer electrodes SP1 or the second spacer electrodes SP2 which are formed on the sidewalls of the second conductive patterns CP2 facing each other may be spaced apart from each other as shown in FIG. 4A. The first spacer electrodes SP1 and the second spacer electrodes SP2 may extend along sidewalls of the corresponding second interlayer insulating layers ILD2, respectively.

Each of the second conductive patterns CP2 may include at least one of a silicon layer, a metal silicide layer, a metal layer, and a metal nitride layer. In an embodiment, each of the second conductive patterns CP2 may include metal for low resistance wiring. In an embodiment, each of the second conductive patterns CP2 may include a metal such as, but not limited to, at least one of tungsten (W), cobalt (Co), and ruthenium (Ru). A barrier pattern that prevents direct contact between the second interlayer insulating layers ILD2 and the second conductive patterns CP2 may be further formed.

The second interlayer insulating layers ILD2 may include various insulating materials. For example, the second interlayer insulating layers ILD2 may include a silicon oxide layer.

The second vertical structure VP2 may include a second slit insulating layer VI2 and a second vertical conductive pattern VCP2 which extend in the first direction Z. The second vertical conductive pattern VCP2 may extend towards the first vertical conductive pattern VCP1 to be coupled with the first vertical conductive pattern VCP1. The second slit insulating layer VI2 may be disposed between each of the slit side patterns SS and the second vertical conductive pattern VCP2. The second vertical conductive pattern VCP2 may be insulated from the slit side patterns SS by the second slit insulating layer VI2. The second slit insulating layer VI2 and the second vertical conductive pattern VCP2 may have a linear shape extending in the first horizontal direction X as shown in FIG. 3B. The second slit insulating layer VI2 may include an oxide layer. The second vertical conductive pattern VCP2 may include various conductive materials. For example, the second vertical conductive pattern VCP2 may include metal.

The second slit insulating layer VI2 may cover a sidewall of each of the second spacer electrodes SP2 as shown in FIG. 4A, or may cover sidewalls of the electrode portions EP and the second interlayer insulating layers ILD2 of each of the slit side patterns SS as shown in FIG. 4B.

The second contact plug CT2 may be coupled to the uppermost electrode portion T of each of the second conductive patterns CP2 and extend in the first direction Z.

The second channel structures CH2 surrounded with the second interlayer insulating layers ILD2 and the electrode portions EP may be covered by the second upper insulating layer UI2. The gate insulating layers GI may be disposed between the second channel structures CH2 and the electrode portions EP. Each of the gate insulating layers GI may extend along an outer wall of the second channel structure CH2.

The first contact plugs CT1 and the second contact plug CT2 may extend to pass through the second upper insulating layer UI2.

Figure 5:
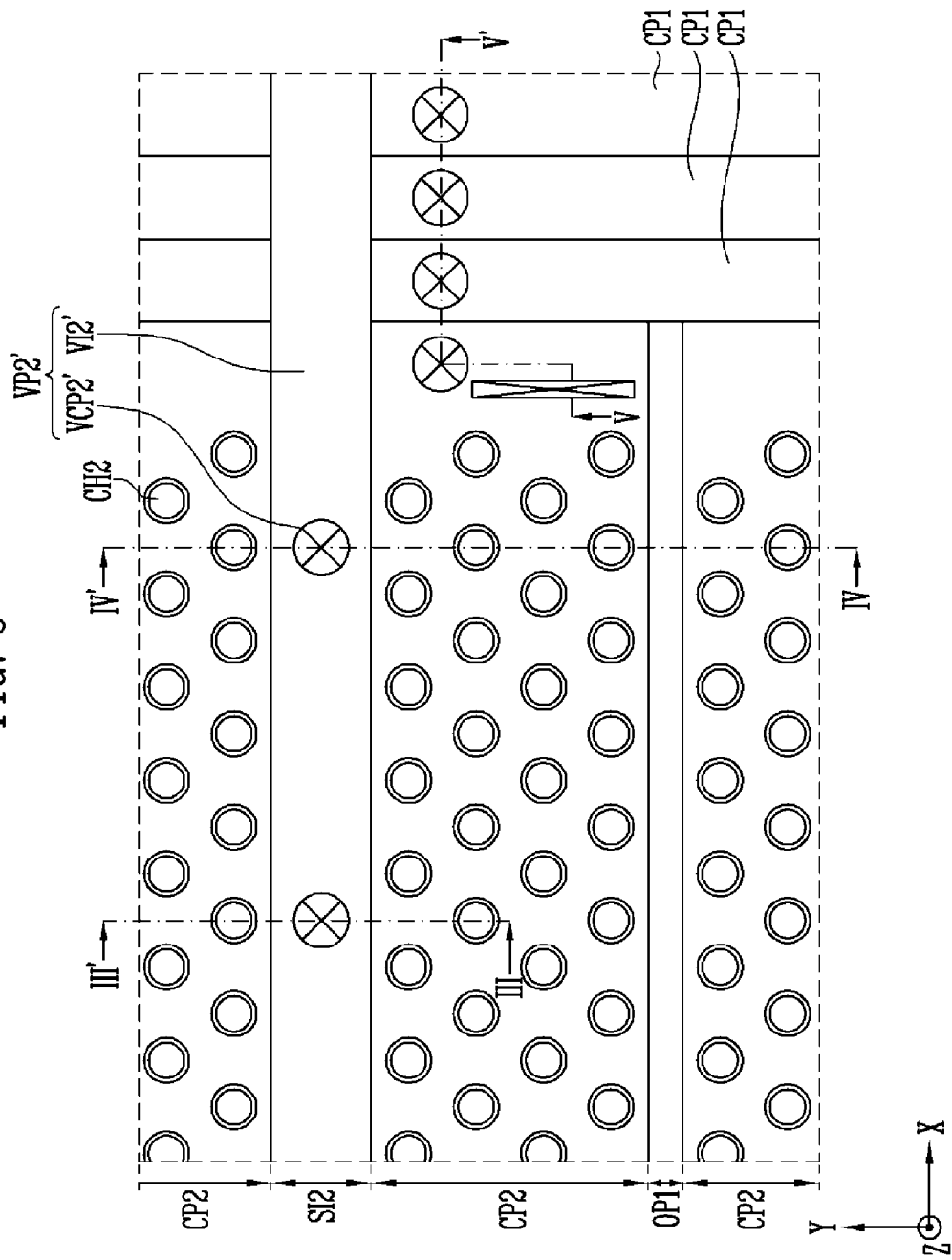
FIGS. 5 and 6 are diagrams illustrating an example of a variation of a first vertical structure and a second vertical structure.
Figure 6:
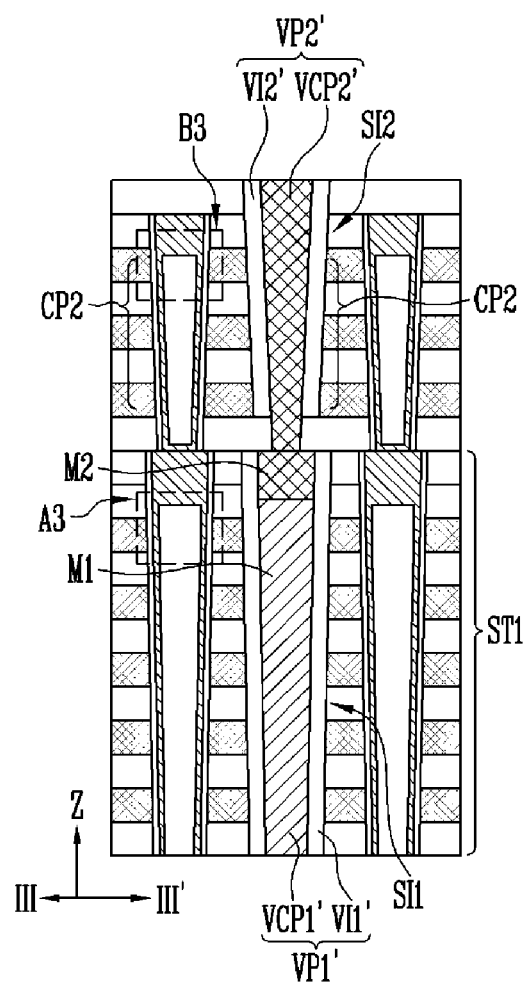

The first vertical structure VP1 and the second vertical structure VP2 may be variously changed. FIGS. 5 and 6 illustrate examples of variations of the first vertical structure VP1 and the second vertical structure VP2. Hereinafter, any repetitive descriptions of the same structure will be omitted.

FIG. 5 is a plan view illustrating a layout of a semiconductor device according to an embodiment. For example, FIG. 5 is a plan view illustrating a layout of the second conductive patterns CP2 penetrated by the second channel structures CH2.

Referring to FIG. 5, as described above with reference to FIG. 3B, the second conductive patterns CP2 may be separated from each other by the second slit SI2 or the first opening OP1, and expose the end portions of the first conductive patterns CP1. According to an embodiment illustrated in FIG. 5, a second vertical structure VP2' may include a second silt insulating layer VI2' and second vertical conductive patterns VCP2'.

The second slit insulating layer VI2' may fill the second slit SI2 and extend in the first horizontal direction X. The second slit insulating layer VI2' may include an oxide layer. The second vertical conductive patterns VCP2' may pass through the second slit insulating layer VI2'. The second vertical conductive patterns VCP2' may be disposed to be spaced apart from each other in the first horizontal direction X. Each of the second vertical conductive patterns VCP2' may include various conductive materials, for example, metal.

FIG. 6 is a cross-sectional diagram of a semiconductor device taken along line III-III' shown in FIG. 5.

Referring to FIG. 6, the second slit SI2 may overlap the first slit SI1 separating the first stack structures ST1 from each other. The second vertical structure VP2' may overlap a first vertical structure VP1' disposed in the first slit SI1.

The first vertical structure VP1' may include a first slit insulating layer VI1' and a first vertical conductive pattern VCP1'. The first slit insulating layer VI1' may be formed on a sidewall of a first slit SI1 to cover a sidewall of each of first stack structures ST1. The first vertical conductive pattern VCP1' may be formed on a sidewall of the first silt insulating layer VI1'. According to an embodiment illustrated in FIG. 6, the first vertical conductive pattern VCP1' may at least include a first conductive material M1 and a second conductive material M2. The first conductive material M1 may include a doped semiconductor layer. According to an embodiment, the first conductive material M1 may include an n-type impurity. According to an embodiment, the first conductive material M1 may include an n-type doped silicon layer. The second conductive material M2 may include metal. The first conductive material M1 and the second conductive material M2 may extend in the first horizontal direction X as shown in FIG. 3A. The first silt insulating layer VI1' may include an oxide layer. Even when the second vertical conductive pattern VCP2' does not extend in the first horizontal direction X, like the embodiments shown in FIG. 5, since the second conductive material M2 coupled to the second vertical conductive pattern VCP2' includes metal, resistance of a vertical plug defined by coupling the first vertical conductive pattern VCP1' and the second vertical conductive pattern VCP2' may be decreased.

Figure 7A:
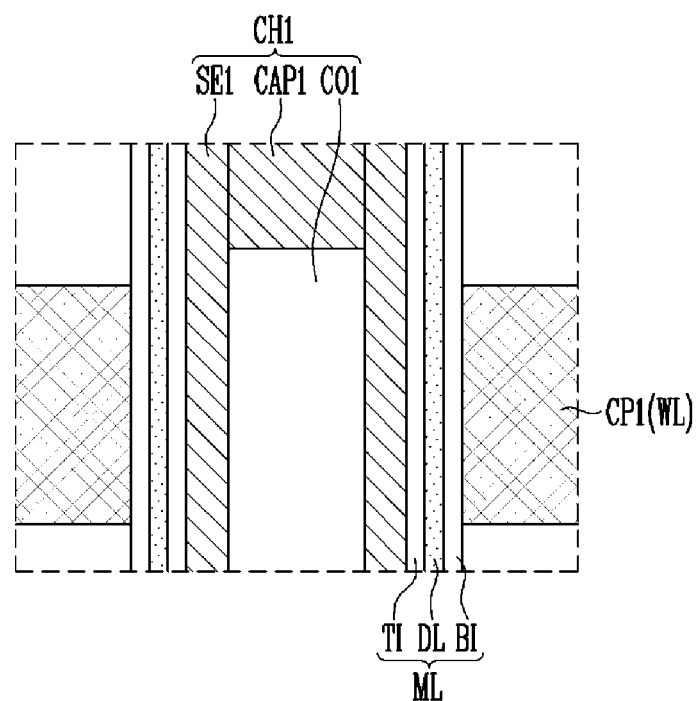
FIGS. 7A and 7B are enlarged cross-sectional diagrams illustrating some regions of semiconductor devices according to embodiments.
Figure 7B:
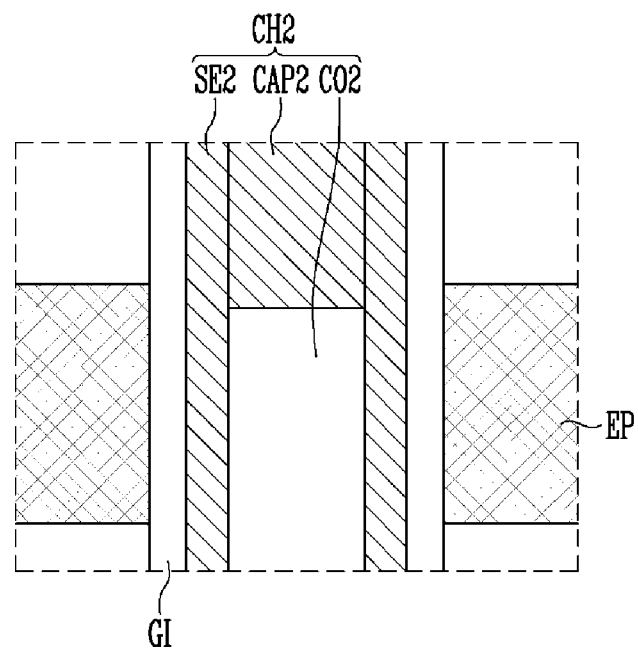

FIGS. 7A and 7B are enlarged cross-sectional diagrams illustrating some regions of semiconductor devices according to embodiments. For example, FIG. 7A is an enlarged diagram of regions A1 to A3 shown in FIGS. 4A, 4B, and 6, respectively. FIG. 7B is an enlarged diagram of regions B1 to B3 shown in FIGS. 4A, 4B, and 6, respectively.

Referring to FIG. 7A, the first channel structure CH1 may include a first semiconductor layer SE1. The first semiconductor layer SE1 may be conformally formed on an inner wall of the multilayer ML, or may completely fill a central region of the multilayer ML. According to an embodiment, the first semiconductor layer SE1 may include a silicon layer.

When the first semiconductor layer SE1 is conformally formed on the inner wall of the multilayer ML, the first channel structure CH1 may further include a first core insulating layer CO1 and a first capping pattern CAP1 which fill a central region of the first semiconductor layer SE1. The first core insulating layer CO1 may have a smaller height than the first semiconductor layer SE1. The first capping pattern CAP1 may be surrounded with an upper end of the first semiconductor layer SE1 which protrudes farther than the first core insulating layer CO1, and may be disposed on the first core insulating layer CO1. The first capping pattern CAP1 may contact the first semiconductor layer SE1. The first capping pattern CAP1 may include a doped semiconductor layer doped with an impurity. According to an embodiment, the first capping pattern CAP1 may include a doped silicon layer including an n-type impurity.

The multilayer ML may extend along a sidewall of the first channel structure CH1. The multilayer ML may include a tunnel insulating layer TI configured to enclose the first channel structure CH1, a data storage layer DL configured to enclose the tunnel insulating layer TI, and a blocking insulating layer BI configured to enclose the data storage layer DL.

The data storage layer DL may include a charge trapping layer, a material layer including a conductive nanodot, or a phase-change material layer.

The data storage layer DL may store data changed by using Fowler-Nordheim tunneling induced by the voltage difference between each of word lines WL among the first conductive patterns CP1 and the first channel structure CH1 which are described with reference to FIGS. 4A and 4B. The data storage layer DL may include a silicon nitride layer capable of trapping charges.

The data storage layer DL may store data based on an operating principal other than Fowler-Nordheim tunneling. For example, the data storage layer DL may include a phase-change material layer and may store data according to a phase change.

The blocking insulating layer BI may include an oxide layer capable of blocking charges. The tunnel insulating layer TI may include a silicon oxide layer capable of charge tunneling.

Referring to FIG. 7B, the second channel structure CH2 may include a second semiconductor layer SE2. The second semiconductor layer SE2 may be conformally formed on an inner wall of the gate insulating layer GI, or may completely fill a central region of the gate insulating layer GI. According to an embodiment, the second semiconductor layer SE2 may include a silicon layer.

When the second semiconductor layer SE2 is conformally formed on the inner wall of the gate insulating layer GI, the second channel structure CH2 may further include a second core insulating layer CO2 and a second capping pattern CAP2 which fill a central region of the second semiconductor layer SE2. The second semiconductor layer SE2 may extend along a sidewall and a bottom surface of the second core insulating layer CO2 and may contact the first channel structure CH1 as shown in FIGS. 4A, 4B, and 6. The second core insulating layer CO2 may have a smaller height than the second semiconductor layer SE2. The second capping pattern CAP2 may be surrounded with an upper portion of the second semiconductor layer SE2 which protrudes farther than the second core insulating layer CO2, and may be disposed on the second core insulating layer CO2. The second capping pattern CAP2 may contact the second semiconductor layer SE2. The second capping pattern CAP2 may include a doped semiconductor layer doped with an impurity. According to an embodiment, the second capping pattern CAP2 may include a doped silicon layer including an n-type impurity.

The gate insulating layer GI may be disposed between the second channel structure CH2 and the electrode portion EP of the second conductive pattern. The gate insulating layer GI may extend along the sidewall of the second channel structure CH2.

FIGS. 8A and 8B are plan views illustrating examples of variations of the connecting portion CN according to an embodiment. For example, each of FIGS. 8A and 8B is a plan view illustrating a layout of the second conductive patterns CP2.

Referring to FIGS. 8A and 8B, the second conductive patterns CP2 may be separated from each other by the second slit SI2 or the first opening OP1 as described above with reference to FIG. 3B.

Each of the second conductive patterns CP2 may include at least one connecting portion CN. According to an embodiment, the connecting portion CN may be coupled to the first opening OP1 and may have a bar shape extending in the second horizontal direction Y as shown in FIG. 3B. According to an embodiment, the connecting portion CN may be spaced apart from the first opening OP1 and may have a bar shape extending in the second horizontal direction Y as shown in FIG. 8A. According to an embodiment, two or more connecting portions CN included in each of the second conductive patterns CP2 may be arranged in a line in the second horizontal direction Y and may be spaced apart from each other as shown in FIG. 8B. A longitudinal section of each of the connecting portions CN may be variously designed such as in a polygon, a circle, or an ellipse.

Figure 9A:
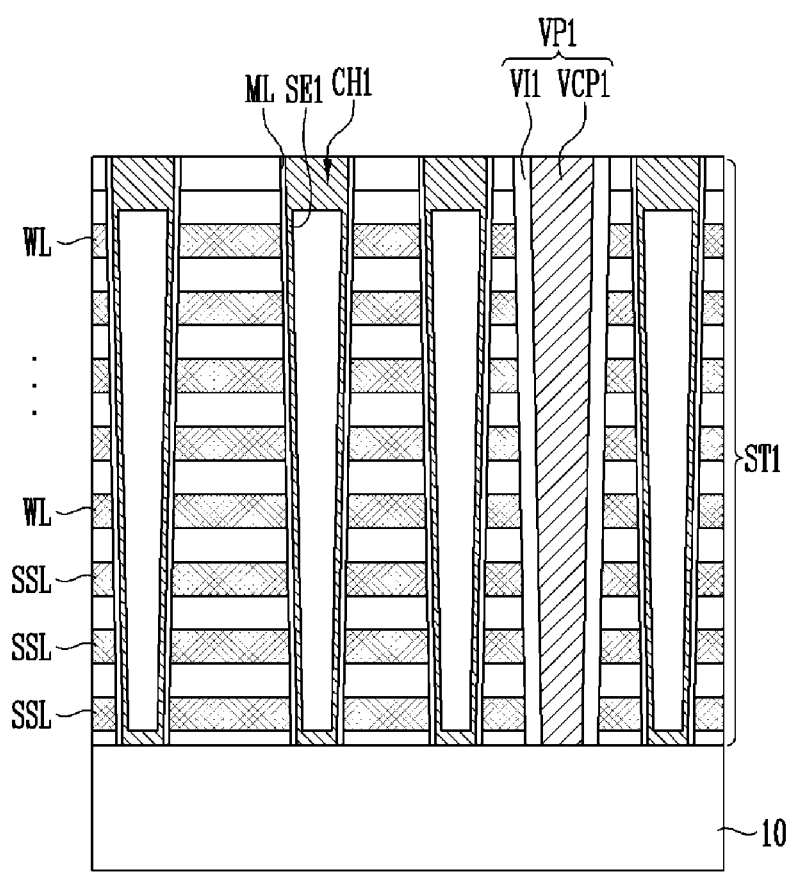
Figure 9B:
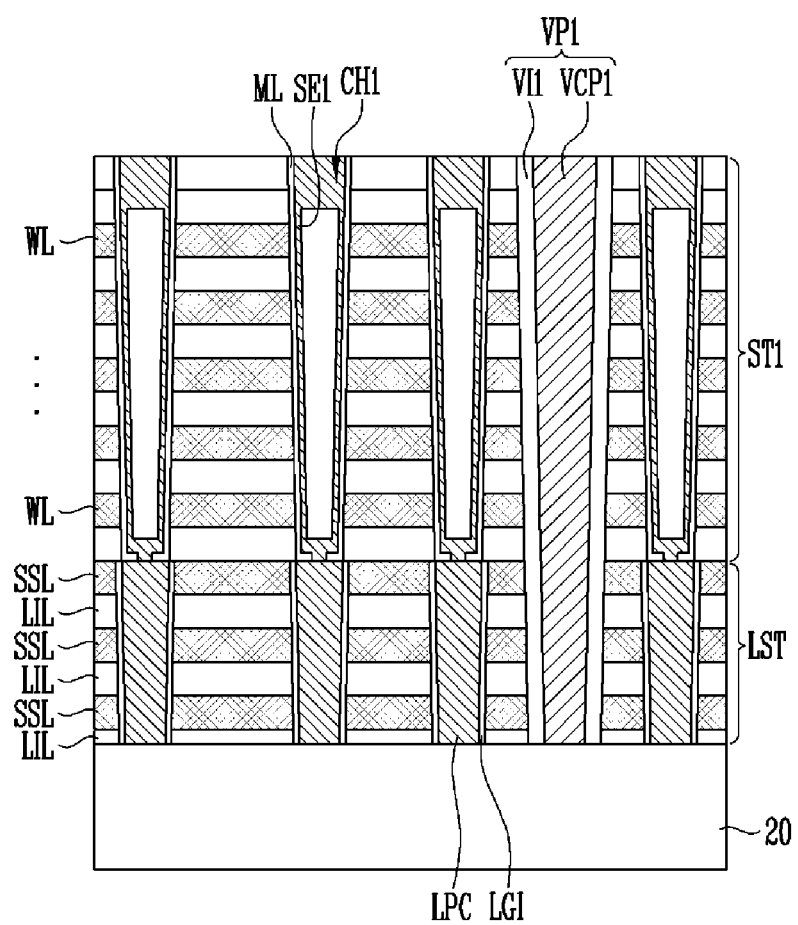

FIGS. 9A to 9C are cross-sectional diagrams illustrating various lower structures disposed under a first stack structure according to an embodiment. The cross-sectional diagrams of the lower structure and the first stack structure shown in FIGS. 9A to 9C may correspond to the cross-sectional diagrams taken along line I-I' shown in FIG. 3A.

Each of structures illustrated in FIGS. 9A to 9C, respectively, may be included in the cell array CAR shown in FIG. 1A or 1B. The first stack structure ST1 shown in each of FIGS. 9A to 9C may be the first stack structure ST1 described with reference to FIGS. 4A and 4B. The first vertical structure VP1 illustrated in each of FIGS. 9A to 9C may include the first slit insulating layer VI1 and the first vertical conductive pattern VCP1 which are described with reference to FIGS. 4A and 4B. The first vertical structure VP1 shown in each of FIGS. 9A to 9C may be replaced by the first vertical structure VP1' described with reference to FIG. 6.

Referring to FIGS. 9A to 9C, a doped semiconductor layer 10, 20, or 30 may be disposed under the first stack structure ST1. The doped semiconductor layer 10, 20, or 30 may extend to be coupled to the first vertical conductive pattern VCP1. The doped semiconductor layer 10, 20, or 30 may serve as a source region. The doped semiconductor layer 10, 20, or 30 which serves as a source region may include a source dopant. For example, a source dopant may include an n-type impurity. The doped semiconductor layer 10 or 20 may be a single layer as shown in FIG. 9A or 9B. The doped semiconductor layer 30 may include two or more layers 30A, 30B, and 30C sequentially stacked on each other as shown in FIG. 9C.

According to an embodiment, the doped semiconductor layers 10, 20, and 30A shown in FIGS. 9A to 9C, respectively, may be formed by injecting an impurity into a surface of the substrate SUB shown in FIG. 1A, or by depositing at least one doped silicon layer on the substrate SUB. According to an embodiment, the doped semiconductor layers 10, 20, and 30A to 30C shown in FIGS. 9A to 9C, respectively, may be formed by forming an insulating layer on the substrate SUB shown in FIG. 1B, and depositing at least one doped silicon layer on the insulating layer.

Referring to FIGS. 9A and 9C, the first conductive patterns of the first stack structure ST1 may serve as the word lines WL or at least one of source select lines SSL. At least the lowermost pattern among the first conductive patterns may serve as the source select line SSL. However, the embodiments are not limited thereto, and one or more first conductive patterns sequentially disposed on the lowermost pattern may serve as the source select lines SSL. The first conductive patterns disposed on at least one of the source select lines SSL may serve as the word lines.

Referring to FIG. 9B, the first conductive patterns of the first stack structure ST1 may serve as the word lines WL. A lower stack structure LST may be further formed between the first stack structure ST1 and the doped semiconductor layer 20. The lower stack structure LST may include at least one lower interlayer insulating layer LIL and at least one source select line SSL which are alternately stacked on each other.

Referring to FIGS. 9A to 9C, the first semiconductor layer SE1 of each of the first channel structures CH1 may be coupled to the doped semiconductor layer 10, 20, or 30.

A bottom surface of the first semiconductor layer SE1 may directly contact the doped semiconductor layer 10 as shown in FIG. 9A. The multilayer ML enclosing each of the first channel structures CH1 may be penetrated by the first semiconductor layer SE1.

The bottom surface of the first semiconductor layer SE1 may be coupled to a lower channel structure LPC passing through the lower stack structure LST as shown in FIG. 9B. The multilayer ML enclosing each of the first channel structures CH1 may be penetrated by the first semiconductor layer SE1.

An outer wall of the lower channel structure LPC may be surrounded with a lower gate insulating layer LGI. The doped semiconductor layer 20 may contact a bottom surface of the lower channel structure LPC. The first semiconductor layer SE1 may be coupled to the doped semiconductor layer 20 via the lower channel structure LPC. The lower channel structure LPC may be formed by growing a semiconductor material by a selective epitaxial growth method or by depositing a semiconductor material. The lower channel structure LPC may include an n-type impurity. The impurity may be doped into the lower channel structure LPC by an in-situ method or an ion injection method.

The first channel structures CH1 may extend into the doped semiconductor layer 30 as shown in FIG. 9C. The doped semiconductor layer 30 may include the first to third layers 30A, 30B, and 30C which are sequentially stacked on each other. Each of the first to third layers 30A, 30B, and 30C may include a doped semiconductor layer. According to an embodiment, each of the first to third layers 30A, 30B, and 30C may include a doped silicon layer.

The first channel structures CH1 may extend into the first layer 30A. The first semiconductor layer SE1 of each of the first channel structures CH1 may directly contact the second layer 30B. The second layer 30B may protrude towards a sidewall of the first semiconductor layer SE1 and may divide the multilayer into a first multilayer pattern ML1 and a second multilayer pattern ML2. The third layer 30C may be omitted in some cases.

Referring to FIGS. 9A to 9C, the first vertical conductive pattern VCP1 may extend to contact the doped semiconductor layer 10, 20, or 30. The first vertical conductive pattern VCP1 may extend to pass through the lower stack structure LST and to contact the doped semiconductor layer 20 as shown in FIG. 9B. The first slit insulating layer VI1 may extend to cover a sidewall of the lower stack structure LST. The first vertical conductive pattern VCP1 may extend into the doped semiconductor layer 30 as shown in FIG. 9C. The third layer 30C and the second layer 30B may be penetrated by the first vertical conductive pattern VCP1.

The first vertical conductive pattern VCP1 may serve as a pick-up plug for transferring an electrical signal to the doped semiconductor layer 10, 20, or 30.

According to the structures described above with reference to FIGS. 9A to 9C, memory cells may be formed at intersections of the first channel structures CH1 and the word lines WL, and a source select transistor may be formed at an intersection of each of the first channel structures CH1 and the source select line SSL shown in FIGS. 9A and 9C, or at an intersection of the lower channel structure LPC and the source select line SSL shown in FIG. 9B.

The second conductive patterns CP2 shown in FIGS. 3B, 4A, and 4B may be formed on the structures shown in FIGS. 9A to 9C. The second conductive patterns CP2 may serve as a drain select line. A drain select transistor may be formed at an intersection of each of the second conductive patterns CP2 which serves as the drain select line and each of the second channel structures CH2.

According to a manufacturing method of a semiconductor device according to an embodiment, a process of forming first conductive patterns enclosing first channel structures is separately performed from a process of forming second conductive patterns enclosing second channel structures. Thereby, a level of difficulty of a manufacturing process of a semiconductor device may be decreased. Hereinafter, various embodiments of a manufacturing method of a semiconductor device will be described below.

Figure 10:
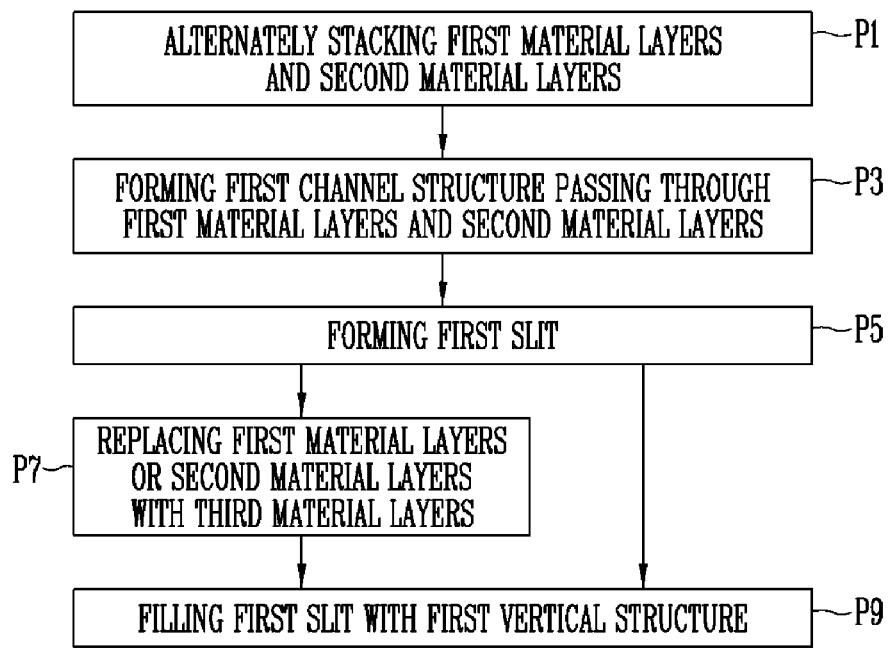
FIG. 10 is a flowchart schematically illustrating a process of forming first stack structures penetrated by first channel structures and separated from each other by a first vertical structure.

FIG. 10 is a flowchart schematically illustrating a process of forming first stack structures penetrated by first channel structures and separated from each other by a first vertical structure.

Referring to FIG. 10, step P1 for alternately stacking first material layers and second material layers may be performed. The first material layers may include a different material from the second material layers.

According to an embodiment, the first material layers may include an insulating material for a first interlayer insulating layer, and the second material layers may include a sacrificial material having a different etch rate from the first material layers. The first material layers may include a silicon oxide layer and the second material layers may include a silicon nitride layer.

According to an embodiment, second material layers may include a conductive material for first conductive patterns, and first material layers may include a sacrificial material having a different etch rate from the second material layers. The first material layers may include an undoped silicon layer and the second material layers may include a doped silicon layer.

According to an embodiment, first material layers may include an insulating material for a first interlayer insulating layer, and second material layers may include a conductive material for first conductive patterns. The first material layers may include a silicon oxide layer and the second material layers may include one of a doped silicon layer, a metal silicide layer, a metal layer, and a metal nitride layer.

After step P1, step P3 for forming a first channel structure passing through the first material layers and the second material layers may be performed. Step P3 may include forming first holes passing through the first material layers and the second material layers, and filling each of the first holes with the first channel structure.

Step P5 for forming a first slit may be performed following step P3. After step P5, steps P7 and P9 may be sequentially performed or step P9 may be performed while skipping step P7 depending on embodiments.

According to an embodiment, when first material layers include an insulating material for a first interlayer insulating layer, and second material layers include a sacrificial material, the second material layers may be replaced with third material layers through first slits during step P7. For example, the second material layers may be selectively removed by bringing an etching material in through a first slit. Damage to the first material layers may be minimized by using a difference in etch rate between the first material layers and the second material layers. Subsequently, regions from which the second material layers are removed may be filled with the third material layers. The third material layers may be a conductive material for first conductive patterns.

According to an embodiment, when second material layers include a conductive material for first conductive patterns and first material layers include a sacrificial material having a different etch rate from the second material layers, the first material layers may be replaced with third material layers through a first slit during step P7. For example, the first material layers may be selectively removed by bringing an etching material in through the first slit. Damage to the second material layers may be minimized by using a difference in etch rate between the first material layers and the second material layers. Subsequently, regions from which the first material layers are removed may be filled with the third material layers. The third material layers may be an insulating material for an interlayer insulating layer.

According to an embodiment, step P7 may be omitted when first material layers include an insulating material for a first interlayer insulating layer and second material layers include a conductive material for first conductive patterns.

According to various embodiments as described above, after first stack structures each including first interlayer insulating layers and first conductive patterns alternately stacked on each other are formed, a first slit may be filled with a first vertical structure during step P9.

FIGS. 11, 12A, 12B, 13A, 13B, and 14A to 14H are diagrams illustrating a manufacturing method of a semiconductor device according to an embodiment.

Figure 11:
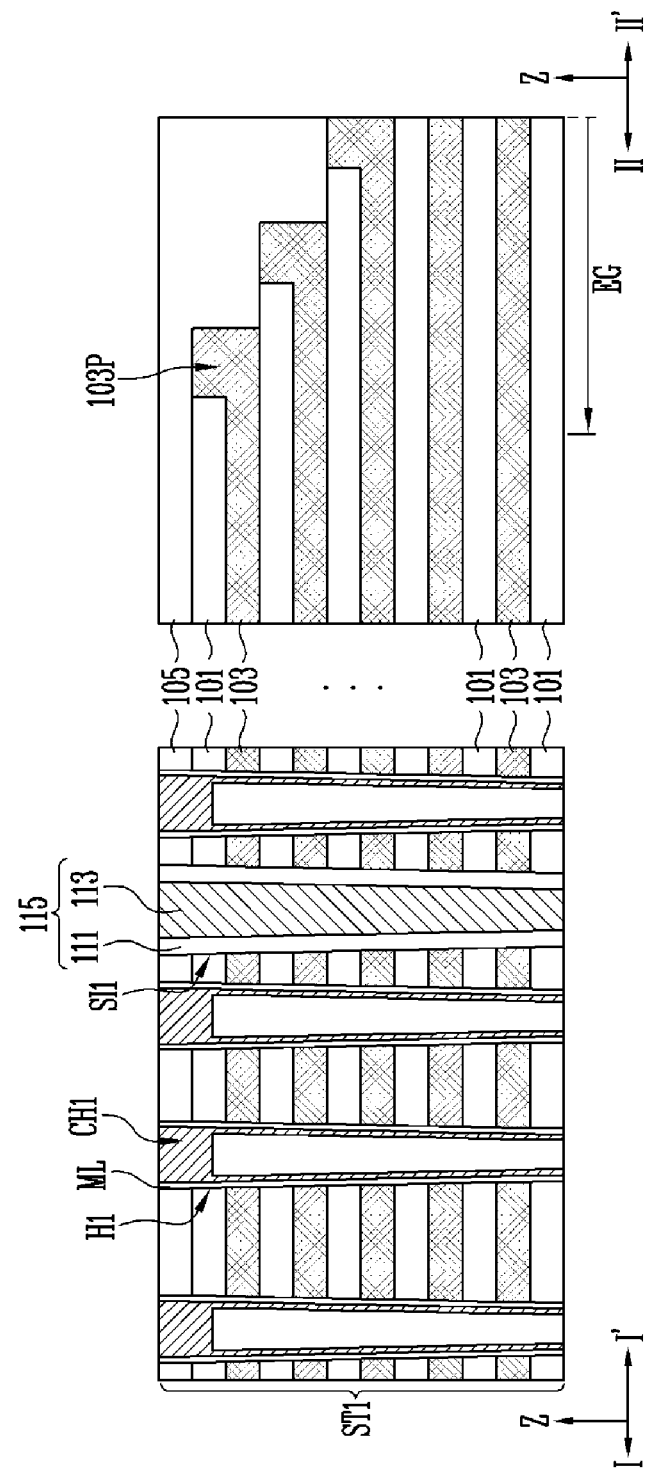

FIG. 11 shows cross-sectional diagrams illustrating an embodiment of a first stack structure formed by the process illustrated in FIG. 10.

Referring to FIG. 11, the first stack structures ST1 penetrated by the first channel structures CH1 may be formed by using a series of processes illustrated in FIG. 10. Each of the first stack structures ST1 may include first interlayer insulating layers 101 and first conductive patterns 103 which are alternately stacked on each other, and may be penetrated by the first channel structures CH1. The first conductive patterns 103 may be stacked to form a stepped shape at the end portion EG of each of the first stack structures ST1.

As described above, to form the first conductive patterns 103 to have the stepped shape, a process for pattering the first material layers and the second material layers which are described above with reference to FIG. 10 into a stepped shape may be further performed. The process for patterning the first material layers and the second material layers into the stepped shape may be performed between steps P1 and P5 which are illustrated in FIG. 10.

Each of the first conductive patterns 103 may include a pad portion 103P protruding from the end portion EG of each of the first stack structures ST1 in the first direction Z. According to an embodiment, a process for directly forming a conductive pattern on an end portion of each of the second material layers which are patterned into the stepped shape may be further performed to form the pad portion 103P. According to an embodiment, a process for forming a pad pattern on an end portion of each of the second material layers which are patterned into the stepped shape may be further performed to form the pad portion 103P. The pad pattern may include the same material as the second material layers. The pad pattern may be replaced with the third material layers during a step, i.e., P7 of FIG. 10, in which the second material layers are replaced with the third material layers for the first conductive patterns 103.

Each of the first stack structures ST1 may further include a first upper insulating layer 105 covering the stepped structure. A surface of the first upper insulating layer 105 may be planarized by a planarizing process.

The first channel structures CH1 may be formed in first holes H1 during step P3 described above with reference to FIG. 10. Step P3 described above with reference to FIG. 10 may further include forming the multilayer ML on a surface of each of the first holes before forming the first channel structures CH1. The first channel structures CH1 may be formed on the multilayer ML. Each of the first channel structures CH1 and the multilayer ML may have the structure described above with reference to FIG. 7A. The first channel structures CH1, the first holes H1, and the multilayer ML may extend to pass through the first upper insulating layer 105.

The first slit SI1 separating the first stack structures ST1 from each other may extend to pass through the first upper insulating layer 105. The first slit SI1 may be filled with a first vertical structure 115 during step P9 illustrated in FIG. 10. Step P9 may include forming a first slit insulating layer 111 and forming a first vertical conductive pattern 113.

According to an embodiment, forming the first slit insulating layer 111 may include conformally forming an insulating layer on the sidewall of the first slit SI1. According to an embodiment, forming the first slit insulating layer 111 may include completely filling the first slit SI1 with an insulating material, and etching the insulating material to expose a bottom surface of the first slit SI1.

The first vertical conductive pattern 113 may at least include a doped semiconductor layer. According to an embodiment, the first vertical conductive pattern 113 may include a doped silicon layer. When the first vertical conductive pattern 113 serves as a source pick-up plug coupled to a source region, the first vertical conductive pattern 113 may include an n-type impurity. According to an embodiment, the first vertical conductive pattern 113 may include the first conductive material M1 and the second conductive material M2 as shown in FIG. 6.

Figure 12B:
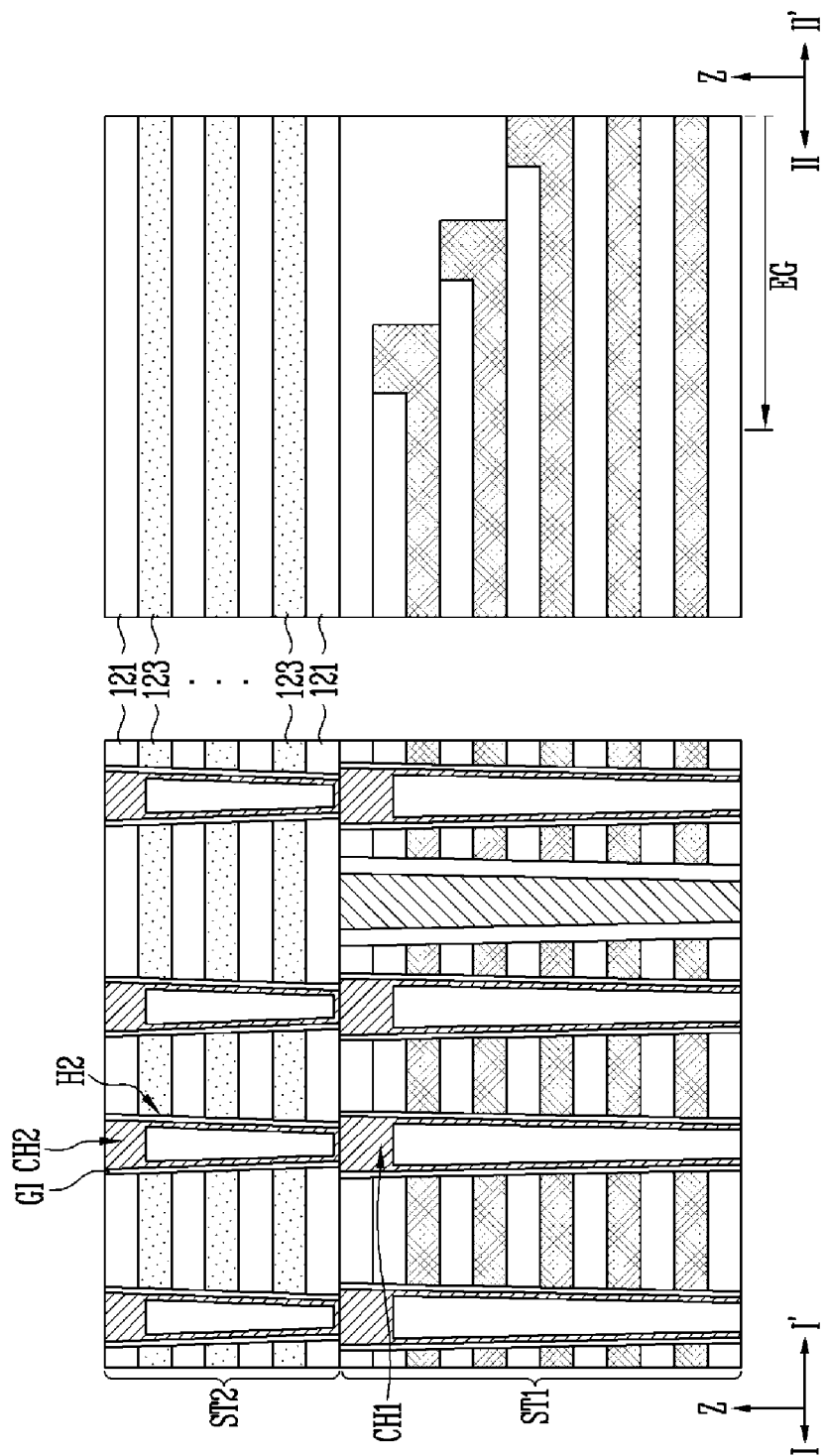

FIGS. 12A and 12B are cross-sectional diagrams illustrating a process of forming a second stack structure penetrated by second channel structures.

Referring to FIG. 12A, a second stack structure ST2 extending to cover the first vertical structure 115 and the end portion EG of each of the first stack structures ST1 may be formed on the first stack structures ST1. The second stack structure ST2 may be formed by alternately stacking second interlayer insulating layers 121 and sacrificial layers 123 in the first direction Z.

The second interlayer insulating layers 121 may include various insulating materials. According to embodiment, the second interlayer insulating layers 121 may include a silicon oxide layer. The sacrificial layers 123 may include a different material from the second interlayer insulating layers 121. For example, the sacrificial layers 123 may include a material having a different etch rate from the second interlayer insulating layers 121. According to an embodiment, the sacrificial layers 123 may include a silicon nitride layer.

After forming the second stack structure ST2, second holes H2 passing through the second interlayer insulating layers 121 and the sacrificial layers 123 of the second stack structure ST2 may be formed. The second holes H2 may expose the first channel structures CH1, respectively. In an embodiment, the second holes H2 may expose the first channel structures CH1 in a one-to-one manner whereby a single second hole H2 exposes a single first channel structure CH1.

Referring to FIG. 12B, the second channel structures CH2 may be formed in the second holes H2, respectively. In an embodiment, the second channel structures CH2 may be formed in the second holes H2 in a one-to-one manner whereby a single second channel structure CH2 is formed in a single second hole H2. The second channel structures CH2 may be coupled to the first channel structures CH1, respectively. In an embodiment, the second channel structures CH2 may be coupled to the first channel structures CH1 in a one-to-one manner whereby a single second channel structure CH2 is coupled to a single first channel structure CH1. The gate insulating layer GI may be formed on a sidewall of each of the second holes H2 before forming the second channel structures CH2. Each of the second channel structures CH2 may be formed on the gate insulating layer GI. Each of the second channel structures CH2 and the gate insulating layer GI may have the structure described above with reference to FIG. 7B.

The second interlayer insulating layers 121 and the sacrificial layers 123 which enclose the second channel structures CH2 coupled to the first channel structures CH1 and are alternately stacked on each other may be formed by the processes described with reference to FIGS. 12A and 12B.

Figure 13B:
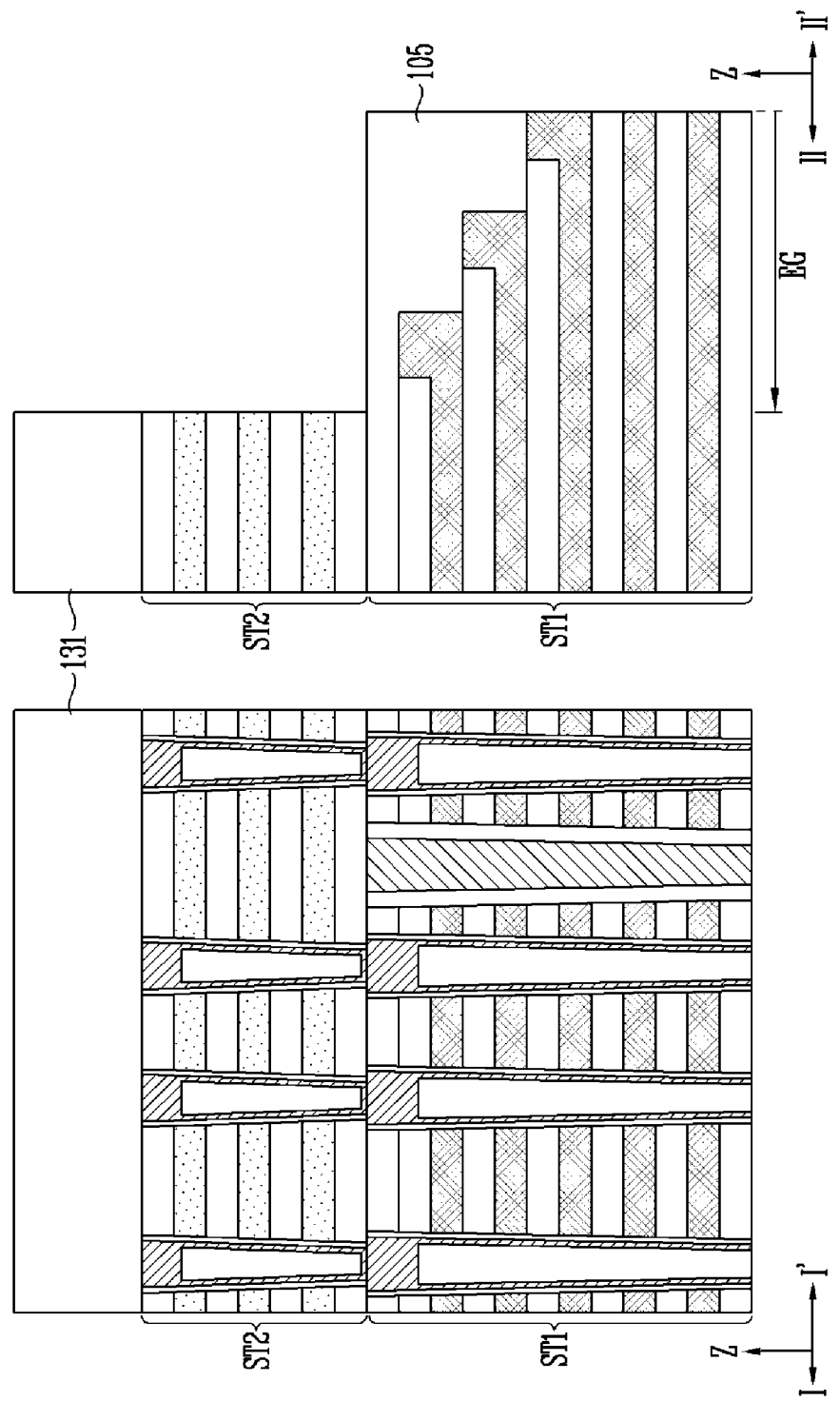

FIGS. 13A and 13B are a plan view and a cross-sectional diagram, respectively, which illustrate a process of exposing an end portion of each of first stack structures.

Referring to FIGS. 13A and 13B, a mask pattern 131 exposing the end portion EG of each of the first stack structures ST1 may be formed on the second stack structure ST2. The mask pattern 131 may be a photoresist pattern.

Thereafter, the second stack structure ST2 may be etched by an etching process using the mask pattern 131 as an etching barrier. Thereby, the end portion EG of each of the first stack structures ST1 may be exposed. For example, the first upper insulating layer 105 corresponding to the end portion EG of each of the first stack structures ST1 may be exposed. A portion of the first slit SI1 and a portion of the first vertical structure VP1 may be exposed by the etched second stack structure ST2.

The mask pattern 131 may be removed after the end portion EG of each of the first stack structures ST1 is exposed.

FIGS. 14A to 14H are cross-sectional diagrams illustrating subsequent processes after the mask pattern is removed.

Figure 14A:
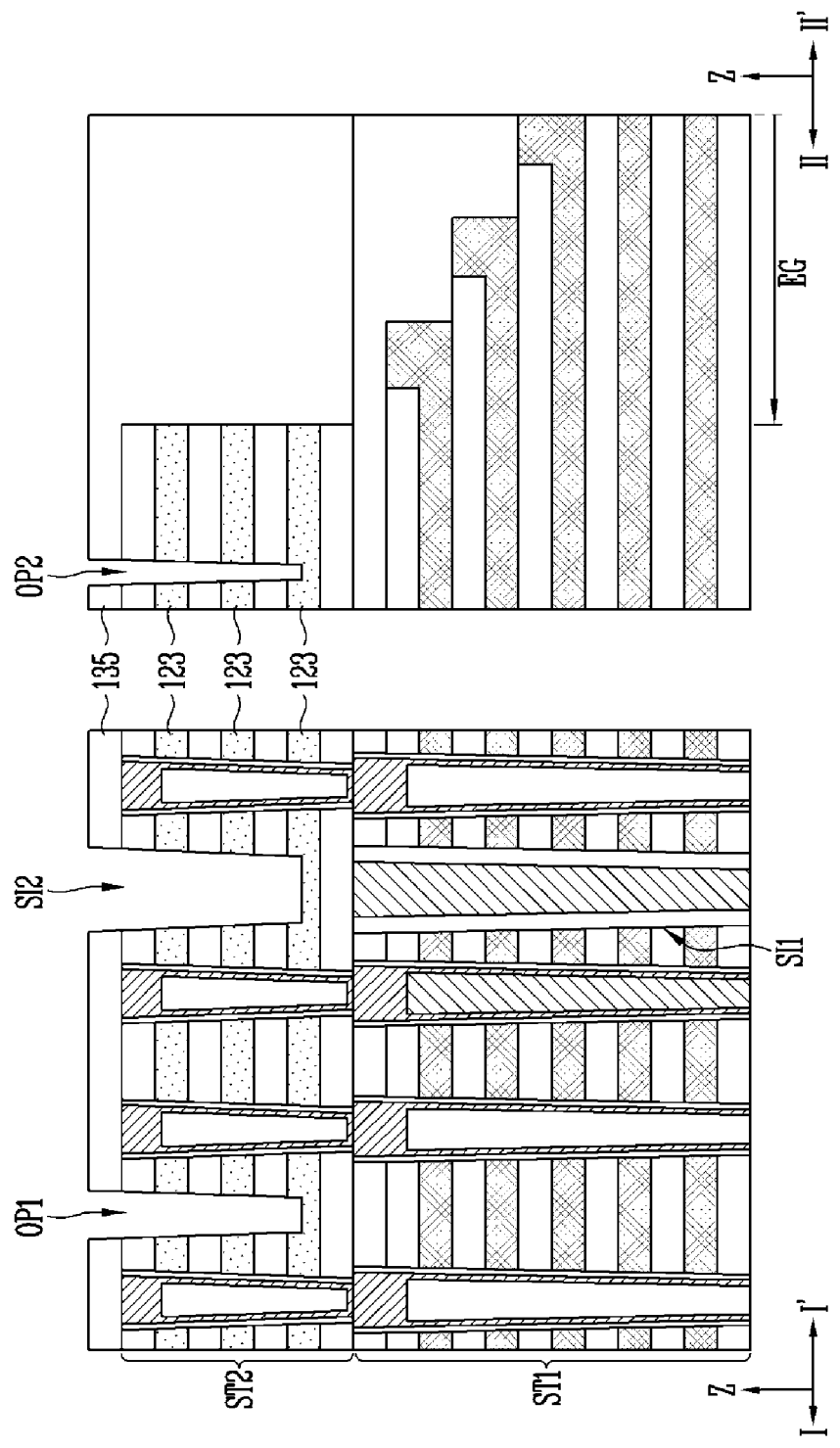

Referring to FIG. 14A, a second upper insulating layer 135 covering the end portion EG of each of the first stack structures ST1 which is exposed by the second stack structure ST2 may be formed on the second stack structure ST2. The second upper insulating layer 135 may include various insulating materials. For example, the second upper insulating layer 135 may include an oxide layer. A surface of the second upper insulating layer 135 may be planarized by a planarizing process.

Subsequently, at least one first opening OP1, at least one second opening OP2, and the second slit SI2 may be formed by etching the second upper insulating layer 135 and the second stack structure ST2. The first opening OP1, the second opening OP2, and the second slit SI2 may be simultaneously formed by an etching process using a mask pattern (not illustrated) having opening regions corresponding to the first opening OP1, the second opening OP2, and the second slit SI2 as an etching barrier. The mask pattern may be a photoresist pattern and may be removed after the first opening OP1, the second opening OP2, and the second slit SI2 are formed. Each of the first opening OP1, the second opening OP2, and the second slit SI2 may expose the sacrificial layers 123.

The second slit SI2 may be formed by etching a first region of the second stack structure ST2 which overlaps the first slit SI1. At least one first opening OP1 and at least one second opening OP2 may be formed at second regions of the second stack structure ST2, respectively, which overlap the first stack structures ST1. The first opening OP1, the second opening OP2, and the second slit SI2 may have the layout described above with reference to FIG. 3B. The second opening OP2 may have one layout among the layouts described above with reference to FIGS. 8A and 8B.

Referring to FIG. 14B, interlayer spaces 141 may be opened by removing the sacrificial layers 123 shown in FIG. 14A through the first opening OP1, the second opening OP2, and the second slit SI2. The interlayer spaces 141 may be formed at the second regions of the second stack structures ST2, respectively, which overlap the first stack structures ST1, and may be defined between the second interlayer insulating layers 121 neighboring each other in the first direction Z.

Figure 14C:
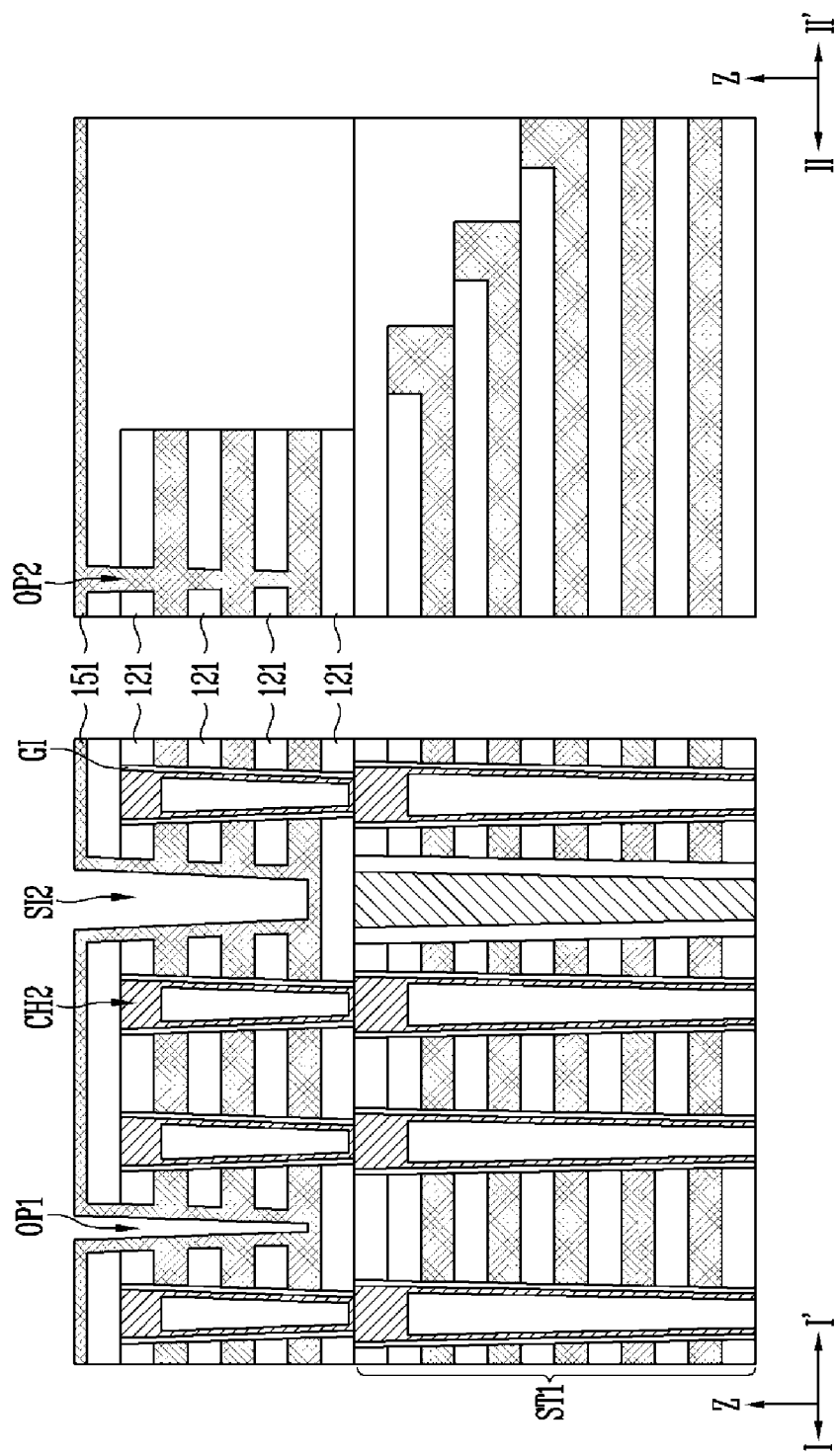

Referring to FIG. 14C, the interlayer spaces 141 shown in FIG. 14B may be filled with a conductive material 151 through the first opening OP1, the second opening OP2, and the second slit SI2.

The conductive material 151 may have a thickness to open a central region of each of the first opening OP1 and the second slit SI2 and to completely fill the second opening OP2. According to an embodiment, as described above with reference to FIG. 3B, the second opening OP2 may have a smaller width than the first opening OP1, and the first opening OP1 may have a smaller width than the second slit SI2. Accordingly, when the conductive material 151 is deposited, the second opening OP2 having a relatively small width may be completely filled and the central region of each of the first opening OP1 and the second slit SI2 which has a relatively large width may be opened by controlling deposition thickness.

The conductive material 151 may be formed by using an Atomic layer deposition (ALD) method, a chemical vapor deposition (CVD) method, and the like. The conductive material 151 may include metal for low resistance wiring. For example, the conductive material 151 may include at least one of a metal layer and a metal silicide layer. For example, a metal layer may include tungsten, cobalt, ruthenium, and the like. A metal silicide layer may include tungsten silicide, cobalt silicide, and the like. However, the embodiment is not limited thereto, and a metal layer and a metal silicide layer may include various metals.

Although not illustrated in FIG. 14C, a barrier thin film may be further formed before forming the conductive material 151. The barrier thin film may prevent metal from diffusing from the conductive material 151 into the second interlayer insulating layers 121 and the gate insulating layer GI. The barrier thin film may include a metal nitride layer. For example, a metal nitride layer may include a titanium nitride, a tungsten nitride, or a tantalum nitride.

As described above with reference to FIGS. 14A to 14C, according to an embodiment, the sacrificial layers of the second stack structures may be replaced with the conductive material 151 through the second slit SI2, the first opening OP1, and the second opening OP2. Since a pattern obstructing inflow of the conductive material 151 is not present at both sides of the second slit SI2, and the first opening OP1 and the second opening OP2 may serve as inlets of the conductive material 151, the sacrificial layers between the second channel structures CH2 may be easily replaced with the conductive material 151.

Figure 14D:
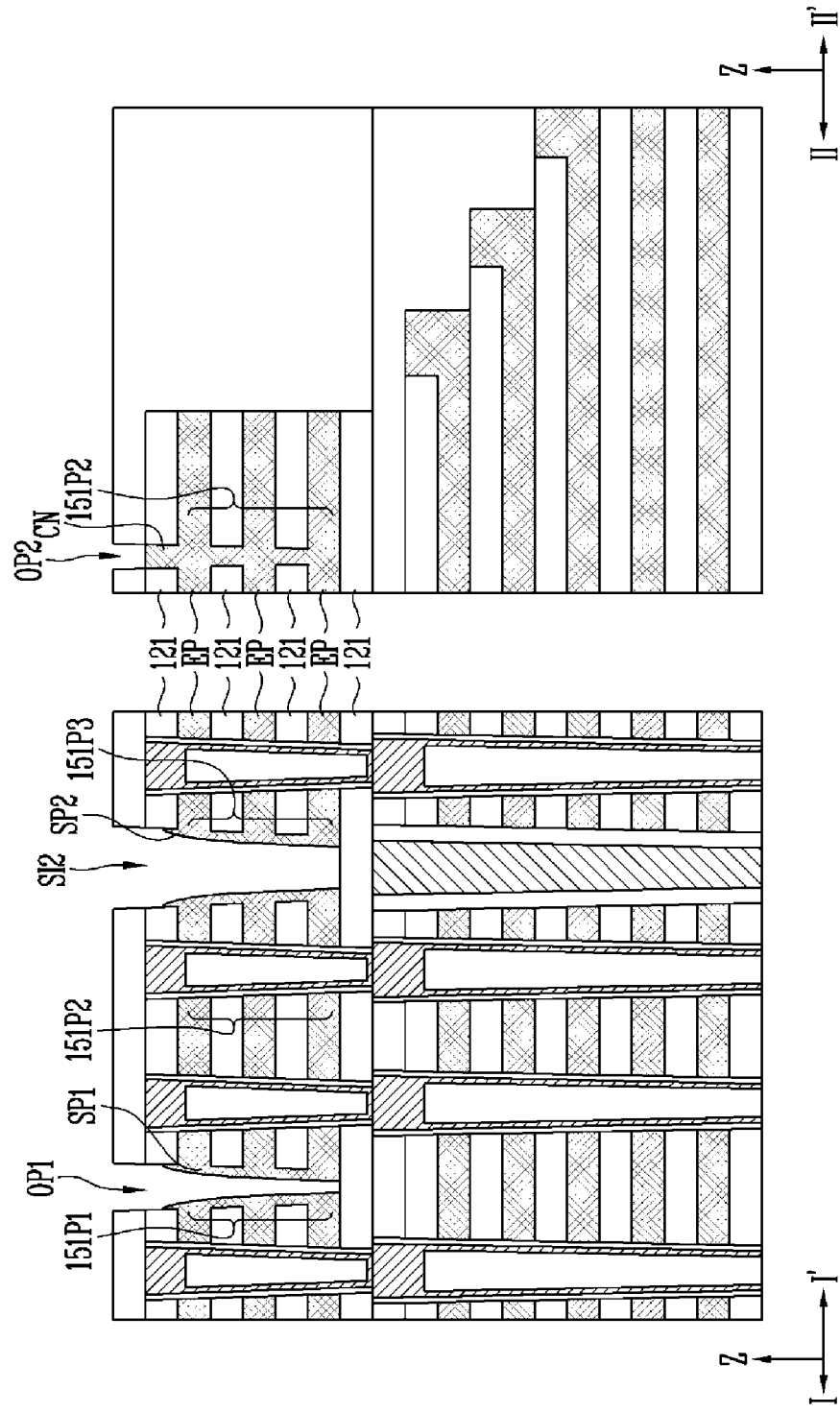

Referring to FIG. 14D, the conductive material 151 shown in FIG. 14C may be etched to expose bottom surfaces of the second slit SI2 and the first opening OP1. Thereby, the conductive material 151 may be divided into second conductive patterns 151P1, 151P2, and 151P3. The second conductive patterns 151P1, 151P2, and 151P3 may be separated from each other by the first opening OP1 or the second slit SI2.

Each of the second conductive patterns 151P1, 151P2, and 151P3 may include the electrode portions EP, the connecting portion CN, and the first spacer electrode SP1, or include the electrode portions EP, the connecting portion CN, and the second spacer electrode SP2 as described above in FIG. 4A. The second interlayer insulating layers 121 may be disposed between the electrode portions EP neighboring each other in the first direction Z. Each of the connecting portion CN, the first spacer electrode SP1, and the second spacer electrode SP2 may extend along sidewalls of the corresponding electrode portions EP and sidewalls of the corresponding second interlayer insulating layers 121.

A portion of the conductive material 151 completely filling the second opening OP2 shown in FIG. 14C may be removed by a predetermined thickness by the etching process illustrated in FIG. 14D, and the rest of the conductive material 151 may remain as the connecting portion CN in the second opening OP2. The connecting portion CN may couple the electrode portions EP stacked on each other in the first direction Z. The upper end of the second opening OP2 may be opened by an etching process. According to an embodiment, since the electrode portions EP disposed to be spaced apart from each other in the first direction Z and the connecting portion CN coupling the electrode portions EP are simultaneously formed, a manufacturing process of a semiconductor device may be simplified.

A portion of the conductive material 151 formed along a surface of each of the first opening OP1 and the second slit SI2 shown in FIG. 14C may be removed by the etching process shown in FIG. 14D. The conductive material may remain as the first spacer electrode SP1 on a sidewall of the first opening OP1 and remain as the second spacer electrode SP2 on a sidewall of the second slit SI2. The first spacer electrode SP1 and the second spacer electrode SP2 may couple the corresponding electrode portions EP, respectively.

The first and second spacer electrodes SP1 and SP2 may remain lower than the connecting portion CN by the etching process shown in FIG. 14D.

Figure 14E:
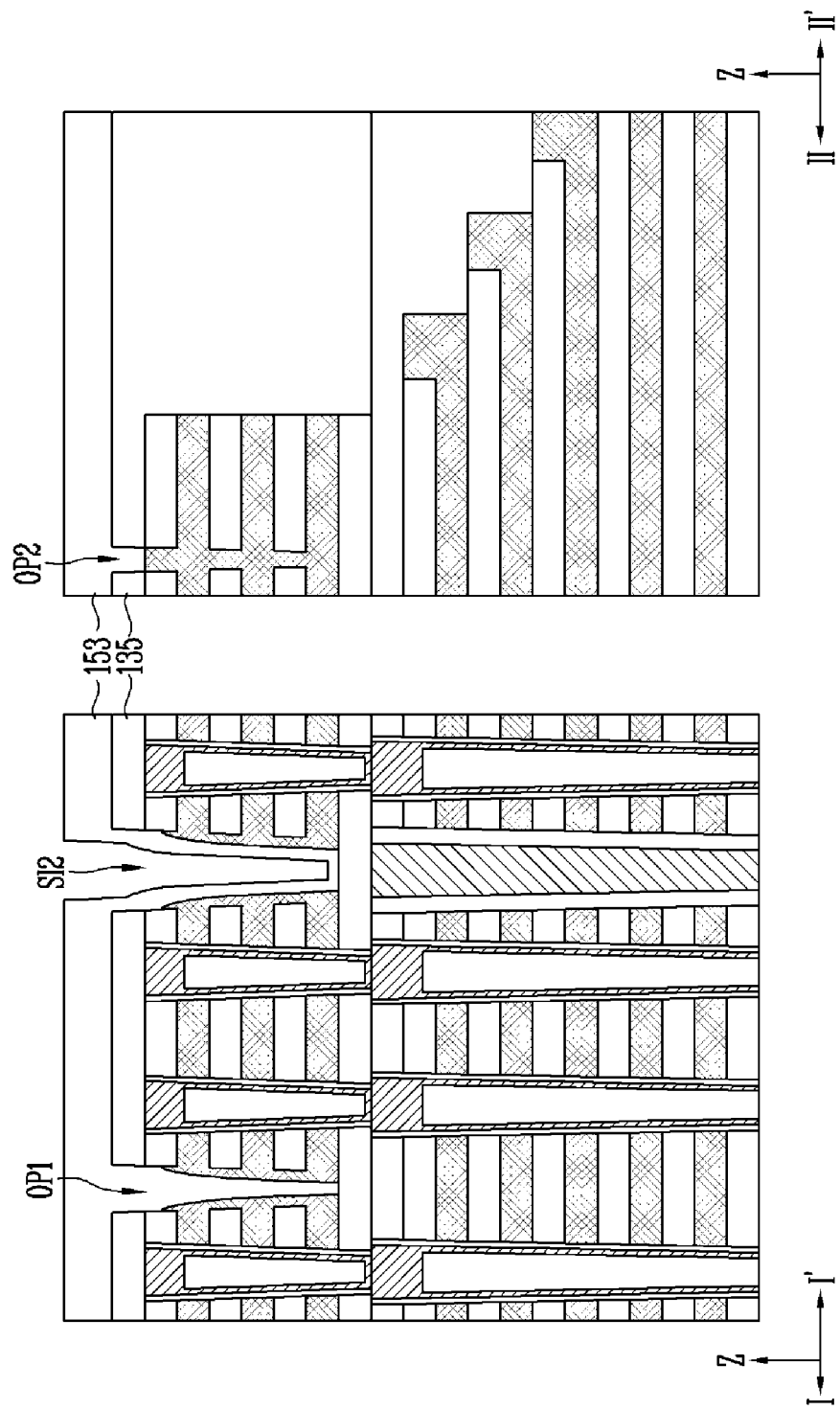

Referring to FIG. 14E, a third upper insulating layer 153 may be formed to completely fill the first opening OP1. The third upper insulating layer 153 may include various insulating materials, for example, an oxide layer.

The third upper insulating layer 153 may be conformally deposited on a surface of the second slit SI2 having a greater width than the first opening OP1. The third upper insulating layer 153 may completely fill the second opening OP2 having a smaller width than the first opening OP1. The third upper insulating layer 153 may extend to cover the second upper insulating layer 135.

Figure 14F:
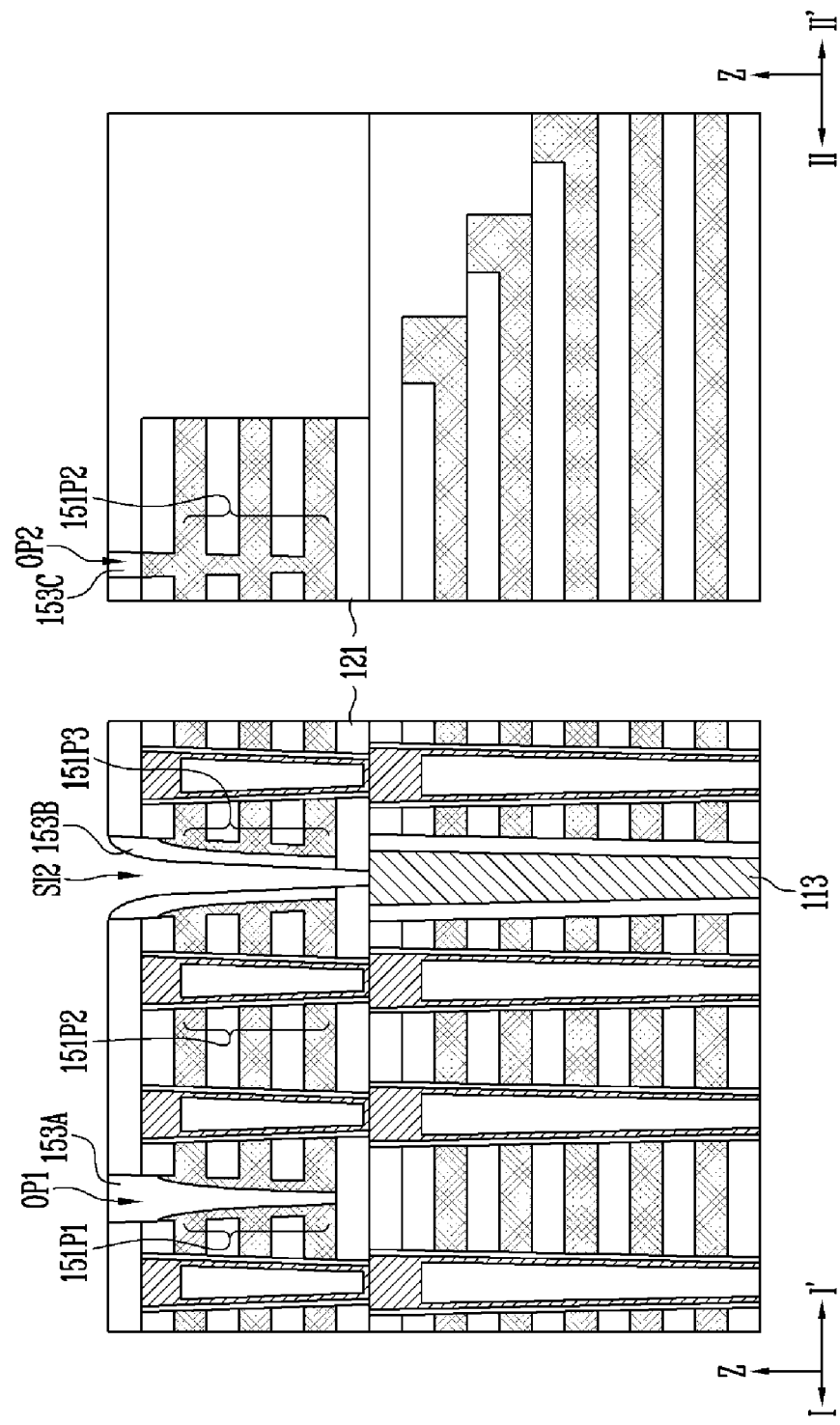

Referring to FIG. 14F, a portion of the third upper insulating layer 153 shown in FIG. 14E may be removed by an etching process such as an etch back process. Thereby, the third upper insulating layer 153 may be divided into a plurality of patterns 153A, 153B, and 153C. When the third upper insulating layer 153 is etched, the second interlayer insulating layer 121 on the first vertical conductive pattern 113 may be etched and the second slit SI2 may extend to expose the first vertical conductive pattern 113.

The plurality of patterns 153A, 153B, and 153C may include the separation insulating layer 153A, the second slit insulating layer 153B, and the upper insulating pattern 153C. The separation insulating layer 153A may fill a space between the second conductive patterns 151P1 and 151P2 in the first opening OP1. The second silt insulating layer 153B may be formed on the sidewall of the second slit SI2 and cover a sidewall of each of the second conductive patterns 151P2 and 151P3. The upper insulating pattern 153C may fill an upper end of the second opening OP2.

Figure 14G:
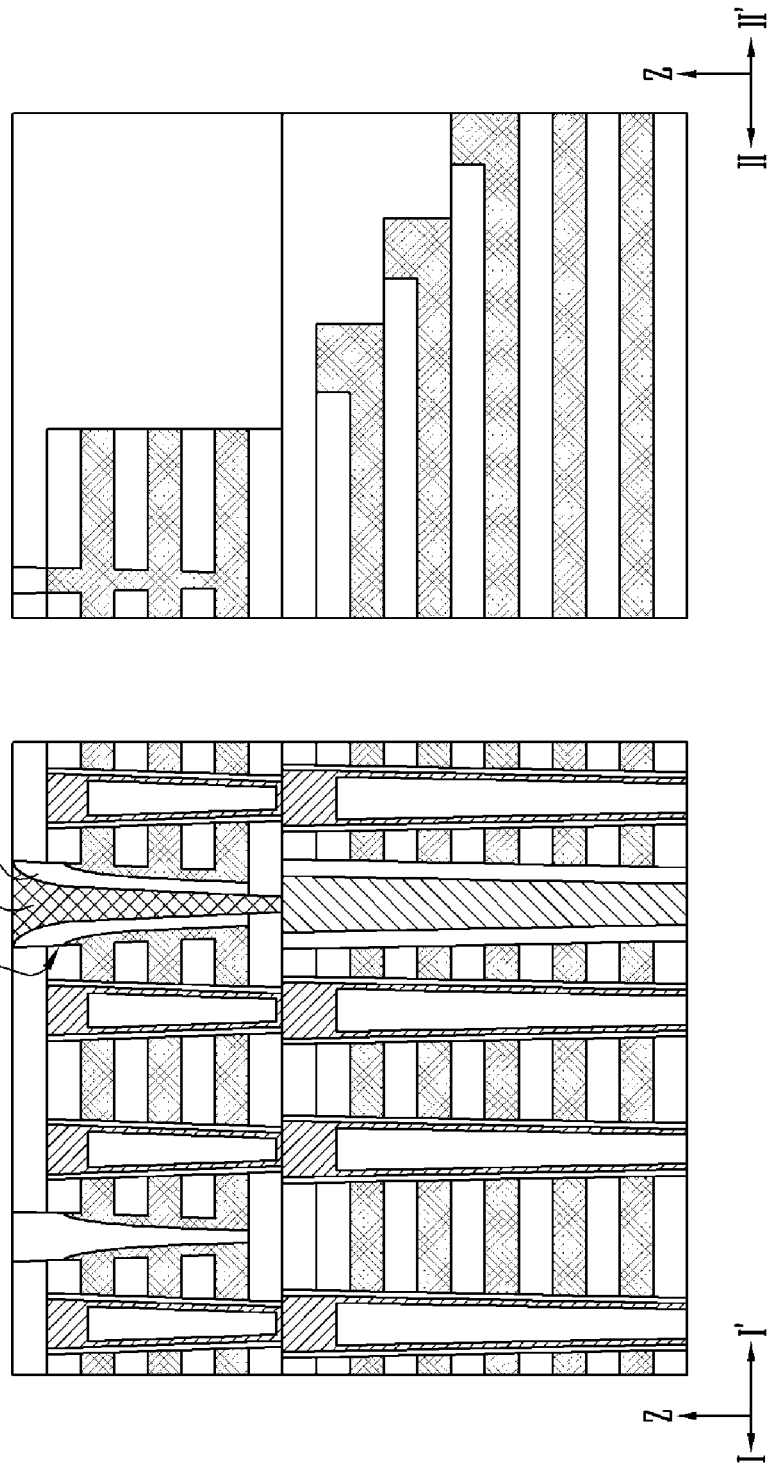

Referring to FIG. 14G, a second vertical conductive pattern 155 filling the second slit SI2 may be formed on the second slit insulating layer 153B. The second vertical conductive pattern 155 may include various conductive materials. The second vertical conductive pattern 155 may include metal to improve resistance. The second vertical conductive pattern 155 may be coupled to the first vertical conductive pattern 113.

Referring to FIG. 14H, first and second contact plugs 161A and 161B passing through at least one of the second upper insulating layer 135, the second interlayer insulating layer 121, and the first upper insulating layer 105 may be formed.

Each of the first conductive patterns 103 may be coupled to the corresponding first contact plug 161A. The first contact plug 161A may pass through the second upper insulating layer 135 and the first upper insulating layer 105 to be coupled to the corresponding first conductive pattern 103. The first contact plug 161A may be coupled to an end portion of the corresponding first conductive pattern 103 which is exposed through the stepped structure formed by the first conductive patterns 103. The first contact plug 161A may be coupled to the pad portion 103P of the corresponding first conductive pattern 103.

Each of the second conductive patterns 151P1, 151P2, and 151P3 may be coupled to the corresponding second contact plug 161B. The second contact plug 161B may pass through the second upper insulating layer 135 and the second interlayer insulating layer 121 to be coupled to the corresponding second conductive pattern (for example, 151P2).

Figure 15:
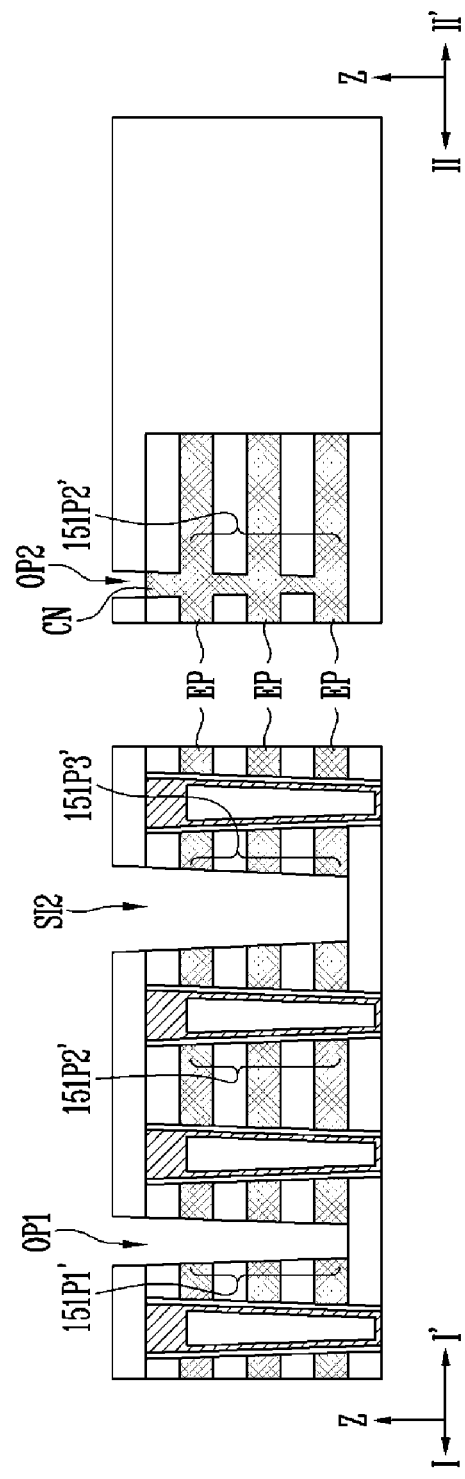
FIG. 15 is a cross-sectional diagram illustrating an example of a variation of a step of separating second conductive patterns from each other.

FIG. 15 is a cross-sectional diagram illustrating an example of a variation of a step of separating second conductive patterns from each other. FIG. 15 illustrates an example of a variation of a subsequent process after forming the conductive material described with reference to FIG. 14C.

Referring to FIG. 15, when the conductive material 151 shown in FIG. 14C is etched to expose the bottom surfaces of the second slit SI2 and the first opening OP1, the upper end of the second opening OP2 may be opened and the sidewall of each of the first opening OP1 and the second slit SI2 may be exposed. Thereby, the conductive material 151 may be divided into second conductive patterns 151P1', 151P2', and 151P3' by the first opening OP1 and the second slit SI2.

Each of the second conductive patterns 151P1', 151P2', and 151P3' may include the electrode portions EP and the connecting portion CN as described above with reference to FIG. 4B.

A portion of the conductive material 151 completely filling the second opening OP2 shown in FIG. 14C may be removed by a predetermined thickness by the etching process illustrated in FIG. 15, and the rest of the conductive material 151 may remain as the connecting portion CN in the second opening OP2. The connecting portion CN may couple the electrode portions EP stacked in the first direction Z.

After the process shown in FIG. 15, the processes described above with reference to FIGS. 14E to 14H may be successively performed.

Figure 16A:
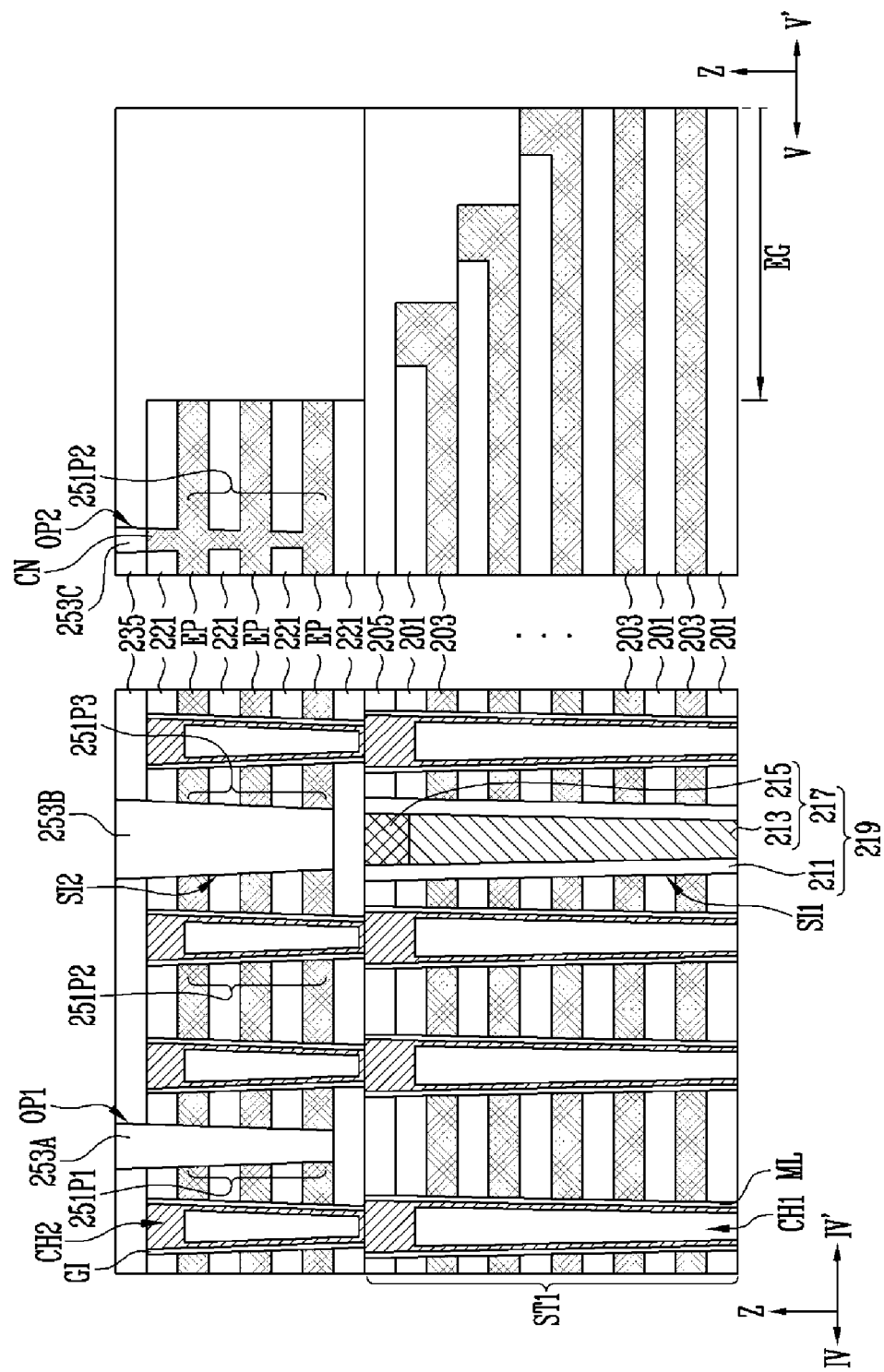
FIGS. 16A to 16C are cross-sectional diagrams illustrating a manufacturing method of a semiconductor device according to an embodiment.
Figure 16B:
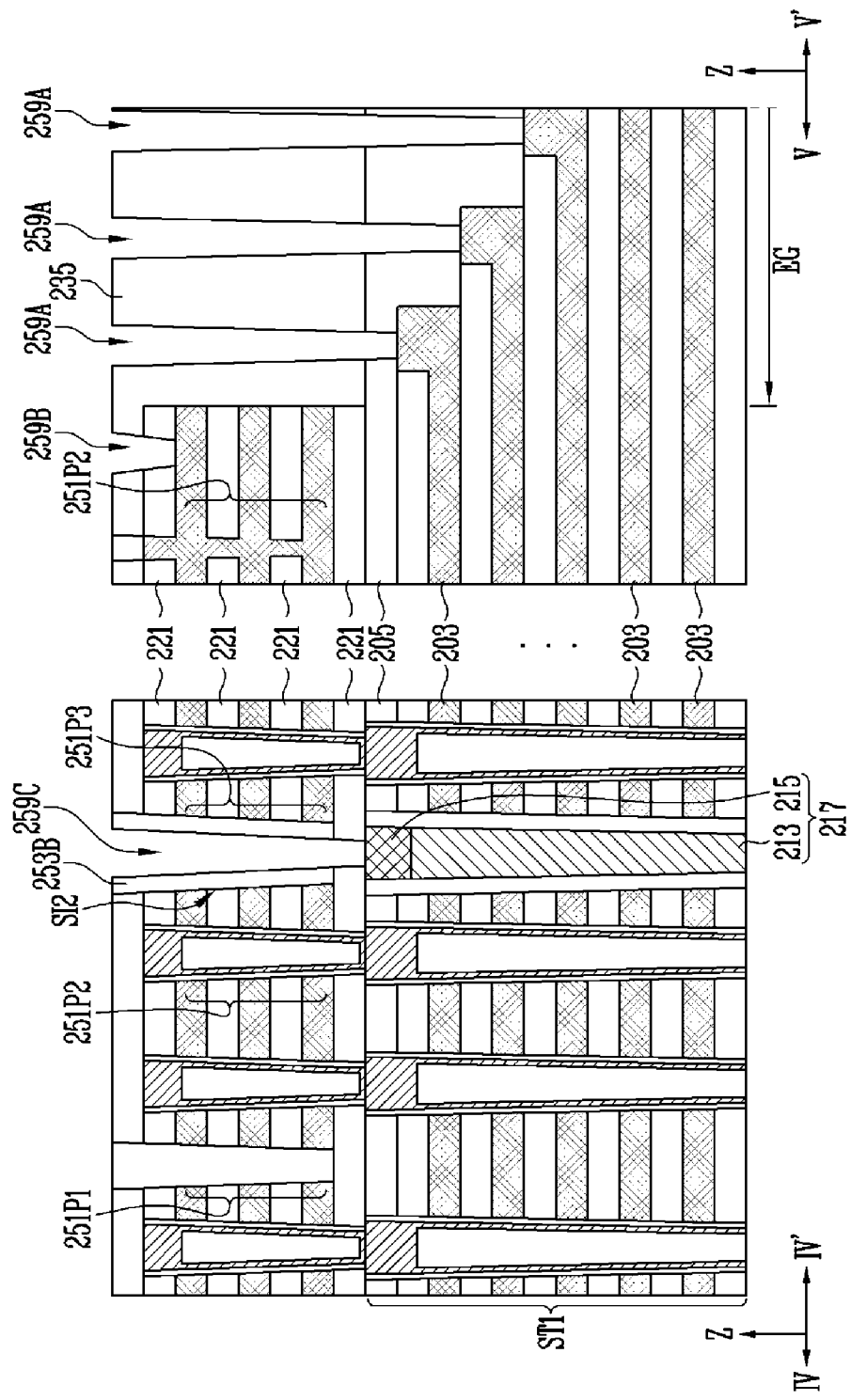
Figure 16C:
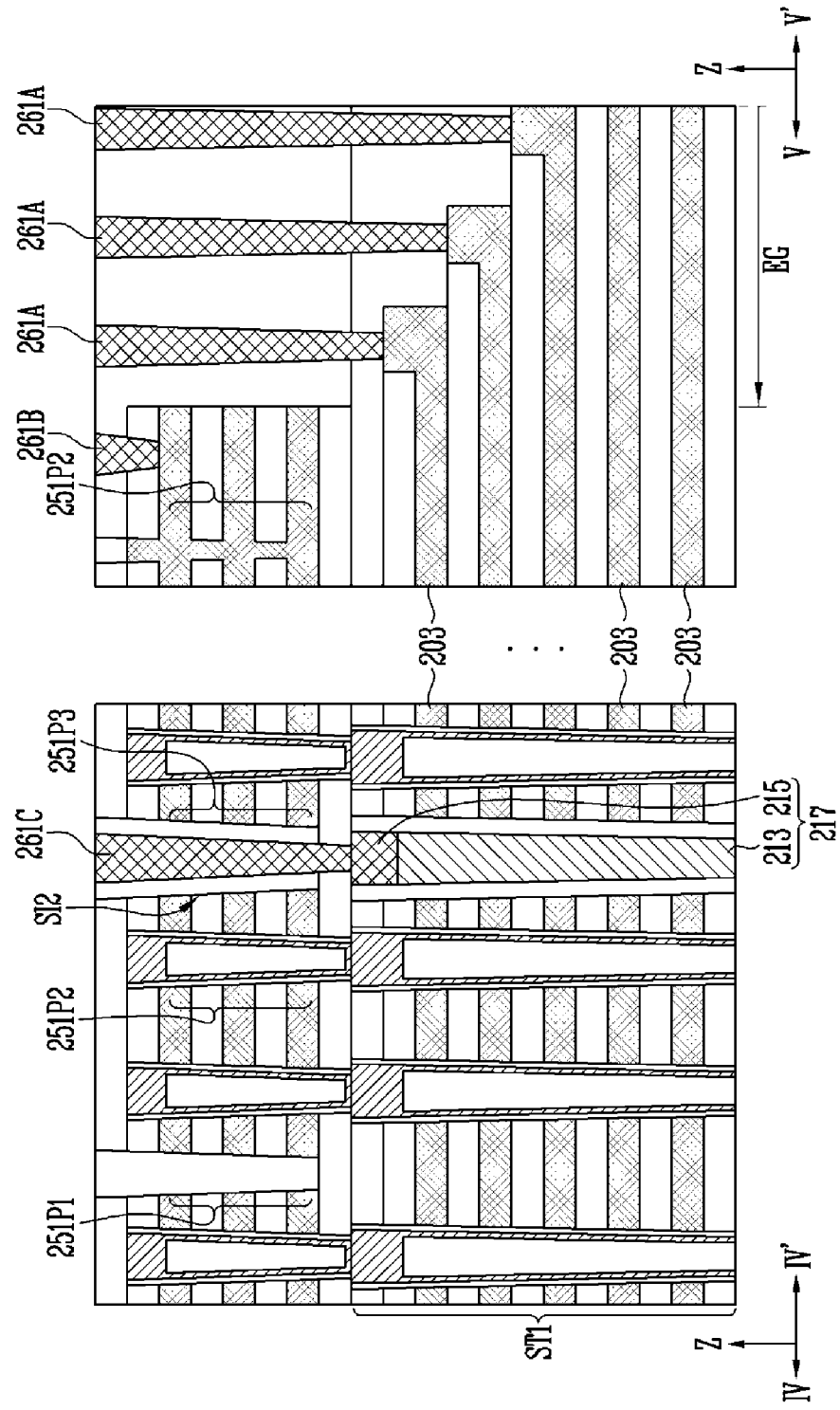

FIGS. 16A to 16C are cross-sectional diagrams illustrating a manufacturing method of a semiconductor device according to an embodiment. FIGS. 16A to 16C illustrate processes used for forming the semiconductor device shown in FIG. 5. Each of FIGS. 16A to 16C may correspond to the cross-sectional diagrams taken along lines IV-IV' and V-V' shown in FIG. 5.

Referring to FIG. 16A, the first stack structures ST1 penetrated by the first channel structures CH1 and separated from each other by the first slit SI1 may be formed using a series of processes shown in FIG. 10. Each of the first stack structures ST1 may have the same structure as described above with reference to FIG. 11. In other words, each of the first stack structures ST1 may include first interlayer insulating layers 201 and first conductive patterns 203 which are alternately stacked on each other in the first direction Z and which enclose the first channel structures CH1. The first conductive patterns 203 may be stacked to have a stepped shape at the end portion EG of each of the first stack structures ST1. The stepped end portions of the first conductive patterns 203 may be covered by a first upper insulating layer 205 extending towards the end portion EG of the first stack structure ST1. The outer wall of each of the first channel structures CH1 may be surrounded with the multilayer ML as described above with reference to FIG. 11.

The first slit SI1 may be filled with a first vertical structure 219 during step P9 shown in FIG. 10. Step P9 may include forming a first slit insulating layer 211 and forming a first vertical conductive pattern 217. Forming the first insulating layer 211 may be performed by using the processes described above with reference to FIG. 11.

The first vertical conductive pattern 217 may at least include a doped semiconductor layer. According to an embodiment, forming the first vertical conductive pattern 217 may include filling a central region of the first slit SI1 which is opened by the first slit insulating layer 211 with a doped semiconductor layer 213, opening an upper end of the first slit SI1 by removing a portion of the doped semiconductor layer 213, and filling the open upper end of the first slit SI1 with an upper conductive layer 215 containing metal. When the first vertical conductive pattern 217 serves as a source pick-up plug coupled to a source region, the doped semiconductor layer 213 may include an n-type impurity. The upper conductive layer 215 containing metal may include at least one of a metal silicide layer, a metal layer, and a metal nitride layer. The upper conductive layer 215 may include metal such as tungsten, cobalt, ruthenium, for low resistance wiring.

After forming the first stack structures ST1 and the first vertical structure 219, second conductive patterns 251P1, 251P2, and 251P3 separated from each other by the first opening OP1 or the second slit SI2 may be formed. The second conductive patterns 251P1, 251P2, and 251P3 may be formed by using the processes described above with reference to FIGS. 12A, 12B, 13A, 13B, and 14A to 14D or the processes described above with reference to FIG. 15.

Each of the second conductive patterns 251P1, 251P2, and 251P3 may expose the end portion EG of the first stack structure ST1. Each of the second conductive patterns 251P1, 251P2, and 251P3 may include the electrode portions EP and the connecting portion CN as described above with reference to FIG. 14D or 15. The electrode portions EP may be penetrated by the second channel structures CH2 coupled to the first channel structures CH1.

The second channel structures CH2 may be surrounded with second interlayer insulating layers 221 and the electrode portions EP which are alternately stacked on each other in the first direction Z. The outer wall of each of the second channel structures CH2 may be surrounded with the gate insulating layer GI. Each of the second conductive patterns 251P1, 251P2, and 251P3 may further include a first spacer electrode or a second spacer electrode as described above with reference to FIG. 14D.

The first opening OP1 and the second slit SI2 between the second conductive patterns 251P1, 251P2, and 251P3 which neighbor each other, and the upper end of the second opening OP2 which is opened above the connecting portion CN may be completely filled with a third upper insulating layer. Subsequently, a surface of the third upper insulating layer may be planarized. The third upper insulating layer may be divided into a separation insulating layer 253A filling the first opening OP1, a second slit insulating layer 253B filling the second slit SI2, and an upper insulating pattern 253C filling the upper end of the second opening OP2.

Referring to FIG. 16B, contact holes 259A, 259B, and 259C passing through at least one of the second slit insulating layer 253B, a second upper insulating layer 235 and the first upper insulating layer 205 may be formed. The contact holes 259A, 259B, and 259C may be divided into first to third contact holes.

The first contact hole 259A may pass through the second upper insulating layer 235 and the first upper insulating layer 205 to expose an end portion of the corresponding first conductive pattern 203. The first contact hole 259A may be disposed on the end portion EG of the first stack structure ST1.

The second contact hole 259B may pass through the second upper insulating layer 235 to expose the corresponding second conductive pattern (for example, 251P2). The second contact hole 259B may further pass through the second interlayer insulating layer 221.

The third contact hole 259C may pass through the second slit insulating layer 253B to expose the first vertical conductive pattern 217. The third contact hole 259C may further pass through the second interlayer insulating layer 221 which remains at a bottom surface of the second slit SI2.

The first, second, and third contact holes 259A, 259B, and 259C may be simultaneously formed by an etching process using a mask pattern (not illustrated) which has open regions that correspond to the first, second, and third contact holes 259A, 259B, and 259C as an etching barrier. The mask pattern may be a photoresist pattern and may be removed after the first, second, and third contact holes 259A, 259B, and 259C are formed.

Referring to FIG. 16C, after filling the first, second, and third contact holes 259A, 259B, and 259C which are shown in FIG. 16B with a conductive material, the conductive material may be etched to be divided into a plurality of patterns 261A, 261B, and 261C. The plurality of patterns 261A, 261B, and 261C may include the first contact plug 261A filling the first contact hole 259A shown in FIG. 16B, the second contact plug 261B filling the second contact hole 259B shown in FIG. 16B, and the second vertical conductive pattern 261C filling the third contact hole 259C shown in FIG. 16B.

A conductive material for the first and second contact plugs 261A and 261B, and the second vertical conductive pattern 261C may include metal to improve resistance. The second vertical conductive pattern 261C may be coupled to the upper conductive layer 215 of the first vertical conductive pattern 219. Each of the first conductive patterns 203 may be coupled to the corresponding first contact plug 261A. Each of the second conductive patterns 251P1, 251P2, and 251P3 may be coupled to the corresponding second contact plug 261B.

The present disclosure may lower a level of difficulty of a manufacturing process of a semiconductor device by separately performing a process of forming first conductive patterns surrounding first channel structures and a process of forming second conductive patterns enclosing second channel structures.

Figure 17:
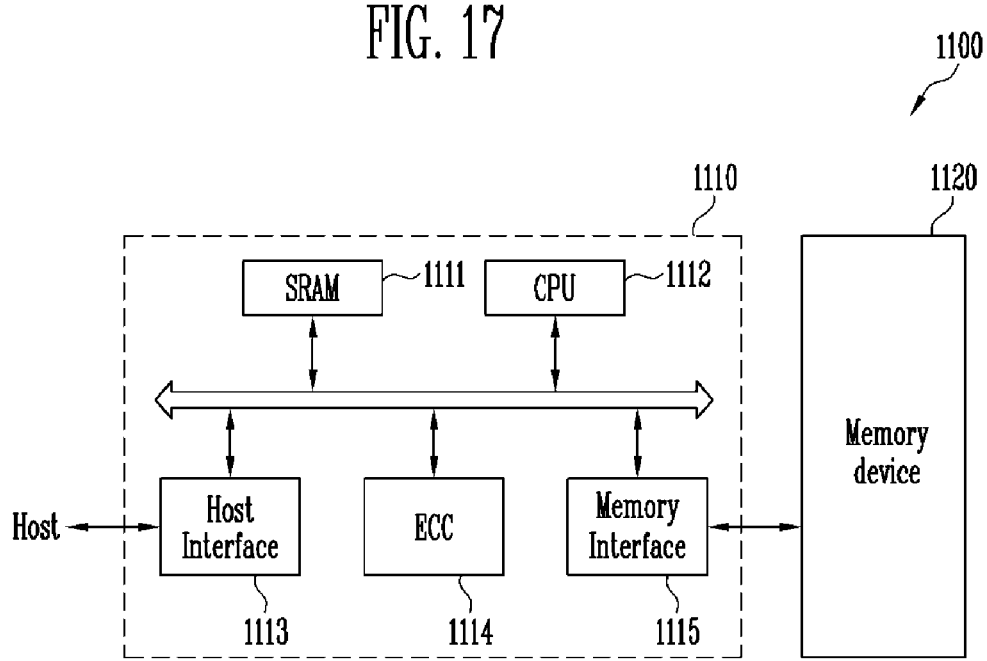
FIG. 17 is a block diagram illustrating a configuration of a memory system according to an embodiment.

FIG. 17 is a block diagram illustrating a configuration of a memory system 1100 according to an embodiment.

Referring to FIG. 17, the memory system 1100 according to the embodiment may include a memory device 1120 and a memory controller 1110.

The memory device 1120 may be a multi-chip package formed of a plurality of flash memory chips. The memory device 1120 may include at least one of the first and second stack structures according to the embodiments described with reference to FIGS. 3A, 3B, 4A, 4B, 5, 6, 8A, and 8B or at least one of the three-dimensional semiconductor devices according to the embodiments described with reference to FIGS. 9A to 9C.

The memory controller 1110 may be configured to control the memory device 1120 and include a Static Random Access Memory (SRAM) 1111, a CPU 1112, a host interface 1113, an Error Correction Code (ECC) 1114, and a memory interface 1115. The SRAM 1111 may serve as an operation memory of the CPU 1112, the CPU 1112 may perform overall control operations for data exchange of the memory controller 1110, and the host interface 1113 may include a data exchange protocol for a host connected with the memory system 1100. In addition, the ECC 1114 may detect and correct errors included in the data read from the memory device 1120, and the memory interface 1115 may perform interfacing with the memory device 1120. In addition, the memory controller 1110 may further include a Read Only Memory (ROM) for storing code data for interfacing with the host.

The above-described memory system 1100 may be a memory card or a Solid State Disk (SSD) equipped with the memory device 1120 and the memory controller 1110. For example, when the memory system 1100 is an SSD, the memory controller 1110 may communicate with an external device (e.g., a host) through one of various interface protocols including a Universal Serial Bus (USB), a MultiMedia Card (MMC), Peripheral Component Interconnection-Express (PCI-E), Serial Advanced Technology Attachment (SATA), Parallel Advanced Technology Attachment (PATA), a Small Computer Small Interface (SCSI), an Enhanced Small Disk Interface (ESDI), and Integrated Drive Electronics (IDE).

Figure 18:
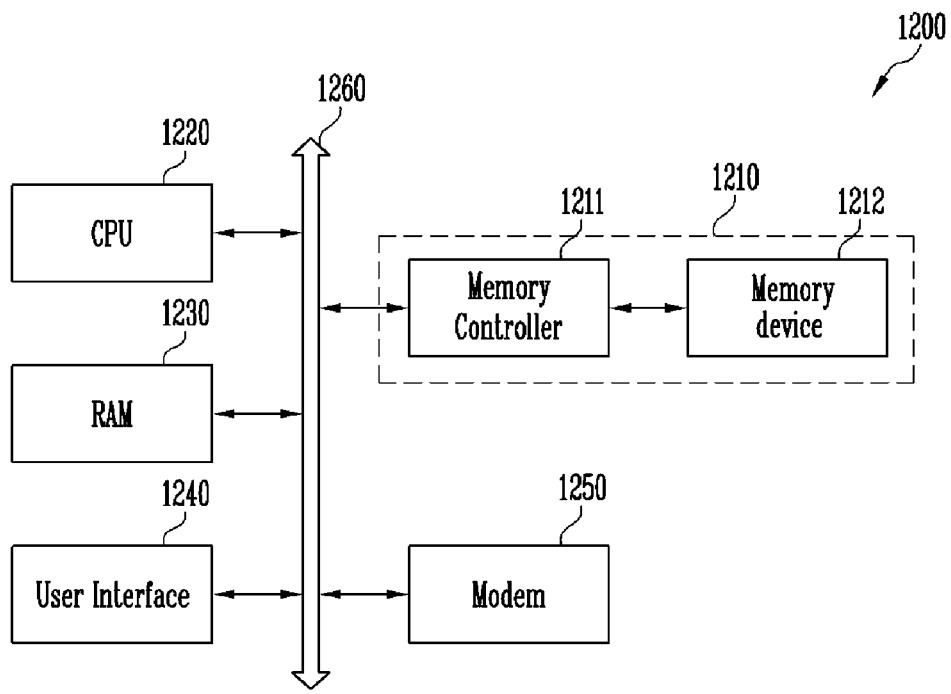
FIG. 18 is a block diagram illustrating a configuration of a computing system according to an embodiment.

FIG. 18 is a block diagram illustrating a configuration of a computing system 1200 according to an embodiment.

Referring to FIG. 18, the computing system 1200 according to an embodiment may include a CPU 1220, a Random Access Memory (RAM) 1230, a user interface 1240, a modem 1250, and a memory system 1210 which are electrically coupled to a system bus 1260. In addition, when the computing system 1200 is a mobile device, a battery for supplying an operating voltage to the computing system 1200 may be further included, and an application chipset, a camera image processor (CIS), a mobile DRAM, and the like may be further included. The memory system 1210 may include a memory controller 1211 and a memory device 1212. In some embodiments, the memory system 1210 may include the memory system 1100 according to the embodiments described above with reference to FIG. 17. The memory device 1212 may include at least one of the first and second stack structures according to the embodiments described with reference to FIGS. 3A, 3B, 4A, 4B, 5, 6, 8A, and 8B or at least one of the three-dimensional semiconductor devices according to the embodiments described with reference to FIGS. 9A to 9C.

So far as not being differently defined, all terms used herein including technical or scientific terminologies have meanings that they are commonly understood by those skilled in the art to which the present disclosure pertains. So far as not being clearly defined in this application, terms should not be understood in an ideally or excessively formal way.

What is claimed is:

1. A semiconductor device, comprising:
a first stack structure including first interlayer insulating layers and first conductive patterns disposed alternately with each other in a first direction;
a second conductive pattern including electrode portions stacked above the first stack structure and a connection portion extending in the first direction to intersect the electrode portions, the electrode portions separated from each other in the first direction, the connection portion coupling the electrode portions;
a vertical channel passing through the first stack structure and the electrode portions of the second conductive pattern; and
a vertical conductive structure including a doped semiconductor portion and a metal portion over the doped semiconductor portion, the vertical conductive structure passing through the first stack structure and the electrode portions of the second conductive pattern and spaced apart from each of the first stack structure and the second conductive pattern,
wherein the doped semiconductor portion of the vertical conductive structure extends in the first direction to overlap at least a portion of a sidewall of the first stack structure.

2. The semiconductor device of claim 1, wherein the doped semiconductor portion includes an n-type impurity.

3. The semiconductor device of claim 1, wherein the doped semiconductor portion of the vertical conductive structure passes through the first stack structure, and
wherein the metal portion of the vertical conductive structure passes through the electrode portions of the second conductive pattern.

4. The semiconductor device of claim 1, wherein the doped semiconductor portion of the vertical conductive structure passes through a lower portion of the first stack structure, and
wherein the metal portion of the vertical conductive structure passes through an upper portion of the first stack structure and the electrode portions of the second conductive pattern.

5. The semiconductor device of claim 1, further comprising:
an upper insulating pattern covering the connection portion,
wherein the vertical conductive structure extends in the first direction to pass through the upper insulating pattern.

6. The semiconductor device of claim 1, further comprising a slit insulating layer extending along a sidewall of the vertical conductive structure to be interposed between each of the electrode portions of the second conductive pattern and the vertical conductive structure.

7. The semiconductor device of claim 1, wherein the vertical channel comprises:
a first channel structure passing through the first stack structure; and
a second channel structure passing through the electrode portions of the second conductive pattern and coupled to the first channel structure.

8. The semiconductor device of claim 7, further comprising:
a multilayer disposed between the first channel structure and the first stack structure; and
a gate insulating layer disposed between the second channel structure and each of the electrode portions of the second conductive pattern.

9. A semiconductor device, comprising:
a first stack structure including first interlayer insulating layers and first conductive patterns disposed alternately with each other in a first direction;
a second conductive pattern including electrode portions stacked above the first stack structure and a connection portion extending in the first direction to intersect the electrode portions, the electrode portions separated from each other in the first direction, the connection portion coupling the electrode portions;
a vertical channel passing through the first stack structure and the electrode portions of the second conductive pattern;
a vertical conductive structure including a doped semiconductor portion and a metal portion over the doped semiconductor portion, the vertical conductive structure passing through the first stack structure and the electrode portions of the second conductive pattern and spaced apart from each of the first stack structure and the second conductive pattern;
a slit insulating layer extending along a sidewall of the vertical conductive structure to be interposed between each of the electrode portions of the second conductive pattern and the vertical conductive structure; and
a spacer electrode extending along a sidewall of the slit insulating layer to be interposed between each of the electrode portions of the second conductive pattern and the slit insulating layer.

10. The semiconductor device of claim 9, wherein the spacer electrode couples the electrode portions of the second conductive pattern.

11. A semiconductor device, comprising:
- a first stack structure including first interlayer insulating layers and first conductive patterns disposed alternately with each other in a first direction;
- a separation insulating layer overlapping a portion of the first stack structure;
- a second conductive pattern overlapping each of portions of the first stack structure disposed at both sides of the separation insulating layer, the second conductive pattern including electrode portions stacked above the first stack structure and a connection portion extending in the first direction to intersect the electrode portions, the electrode portions separated from each other in the first direction, the connection portion coupling the electrode portions;
- a vertical channel passing through the first stack structure and the electrode portions of the second conductive pattern; and
- a vertical conductive structure including a doped semiconductor portion and a metal portion over the doped semiconductor portion, the vertical conductive structure passing through the first stack structure and the electrode portions of the second conductive pattern and spaced apart from each of the first stack structure and the second conductive pattern,
- wherein the connection portion of the second conductive pattern is disposed between the vertical conductive structure and the separation insulating layer.

12. The semiconductor device of claim 11, wherein the doped semiconductor portion includes an n-type impurity.

13. The semiconductor device of claim 11, wherein the doped semiconductor portion of the vertical conductive structure passes through the first stack structure, and
- wherein the metal portion of the vertical conductive structure passes through the electrode portions of the second conductive pattern.

14. The semiconductor device of claim 11, wherein the doped semiconductor portion of the vertical conductive structure passes through a lower portion of the first stack structure, and
- wherein the metal portion of the vertical conductive structure passes through an upper portion of the first stack structure and the electrode portions of the second conductive pattern.

15. The semiconductor device of claim 11, further comprising a slit insulating layer extending along a sidewall of the vertical conductive structure to be interposed between each of the electrode portions of the second conductive pattern and the vertical conductive structure.

16. The semiconductor device of claim 11, further comprising:
- a slit insulating layer extending along a sidewall of the vertical conductive structure to be interposed between each of the electrode portions of the second conductive pattern and the vertical conductive structure; and
- a spacer electrode extending along a sidewall of the slit insulating layer to be interposed between each of the electrode portions of the second conductive pattern and the slit insulating layer.

17. The semiconductor device of claim 16, wherein the spacer electrode couples the electrode portions of the second conductive pattern.

18. The semiconductor device of claim 11, wherein the vertical channel comprises:
- a first channel structure passing through the first stack structure; and
- a second channel structure passing through the electrode portions of the second conductive pattern and coupled to the first channel structure.

19. The semiconductor device of claim 18, further comprising:
- a multilayer disposed between the first channel structure and the first stack structure; and
- a gate insulating layer disposed between the second channel structure and each of the electrode portions of the second conductive pattern.

* * * * *